(12) United States Patent
Takebayashi et al.

(10) Patent No.: US 12,293,932 B2
(45) Date of Patent: May 6, 2025

(54) SUBSTRATE PROCESSING APPARATUS, ELEVATOR AND METHOD OF MANUFACTURING SEMICONDUCTOR DEVICE

(71) Applicant: KOKUSAI ELECTRIC CORPORATION, Tokyo (JP)

(72) Inventors: Yuji Takebayashi, Toyama (JP); Makoto Hirano, Toyama (JP); Koji Shibata, Toyama (JP); Yusaku Okajima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 542 days.

(21) Appl. No.: 17/691,641

(22) Filed: Mar. 10, 2022

(65) Prior Publication Data

US 2022/0199443 A1 Jun. 23, 2022

Related U.S. Application Data

(63) Continuation of application No. PCT/JP2019/038175, filed on Sep. 27, 2019.

(51) Int. Cl.
 *H01L 21/677* (2006.01)
 *C23C 16/40* (2006.01)
 (Continued)

(52) U.S. Cl.
 CPC ...... *H01L 21/67757* (2013.01); *C23C 16/402* (2013.01); *C23C 16/4412* (2013.01);
 (Continued)

(58) Field of Classification Search
 CPC ........ C23C 16/45574; C23C 16/45589; C23C 16/4587; C23C 16/45563
 See application file for complete search history.

(56) References Cited

U.S. PATENT DOCUMENTS 6,190,104 B1 2/2001 Ikeda et al.
6,321,680 B2 11/2001 Cook et al.
(Continued)

FOREIGN PATENT DOCUMENTS

CN 101676432 A 3/2010
JP 2000-068219 A 3/2000
(Continued)

OTHER PUBLICATIONS

Korean Office Action issued on Nov. 30, 2023 for Korean Patent Application No. 10-2022-7008050.
(Continued)

*Primary Examiner* — Hsien Ming Lee
(74) *Attorney, Agent, or Firm* — Volpe Koenig

(57) ABSTRACT

A technique for improving uniformity of film thickness on substrates, includes a substrate processing apparatus having a substrate retainer including substrate and partition plate supports; a reaction tube; a first driver vertically moving the substrate retainer into or out of the reaction tube; a second driver vertically moved by the first driver and rotating the substrate retainer to change a distance between a substrate and a partition plate by moving at least one of the substrate or the partition plate support; a heater; a gas supplier comprising a nozzle; a gas exhauster; and a controller controlling the first driver, the second driver and the gas supplier such that a gas is supplied to the substrate while changing at least one of a relative position of the substrate and a relative position of the partition plate with respect to a hole of the nozzle by driving the second driver.

13 Claims, 10 Drawing Sheets

(51) Int. Cl.
*C23C 16/44* (2006.01)
*C23C 16/458* (2006.01)
*C23C 16/52* (2006.01)
*H01L 21/02* (2006.01)

(52) U.S. Cl.
CPC .......... *C23C 16/4584* (2013.01); *C23C 16/52* (2013.01); *H01L 21/02164* (2013.01); *H01L 21/0217* (2013.01); *H01L 21/02186* (2013.01)

(56) References Cited

U.S. PATENT DOCUMENTS

| | | |
|---|---|---|
| 2002/0017377 A1 | 2/2002 | Koguchi et al. |
| 2003/0000476 A1 | 1/2003 | Matsunaga et al. |
| 2004/0099219 A1 | 5/2004 | Park et al. |
| 2008/0199610 A1 | 8/2008 | Inokuchi et al. |
| 2008/0216742 A1 | 9/2008 | Takebayashi |
| 2009/0081887 A1* | 3/2009 | Inoue ...................... C23C 16/56 257/E21.328 |
| 2009/0145890 A1 | 6/2009 | Matsuura |
| 2009/0305512 A1 | 12/2009 | Matsuura et al. |
| 2010/0068383 A1 | 3/2010 | Kato et al. |
| 2017/0025293 A1 | 1/2017 | Jung et al. |
| 2017/0271144 A1* | 9/2017 | Hashimoto ......... H01L 21/0228 |
| 2017/0287681 A1* | 10/2017 | Nitadori ............ H01J 37/32458 |

FOREIGN PATENT DOCUMENTS

| | | |
|---|---|---|
| JP | 2002-58985 A | 2/2002 |
| JP | 2002-222806 A | 8/2002 |
| JP | 2003-297818 A | 10/2003 |
| JP | 2007-109711 A | 4/2007 |
| JP | 2008-258595 A | 10/2008 |
| KR | 10-2003-0002299 A | 1/2003 |
| KR | 10-2009-0060182 A | 6/2009 |

OTHER PUBLICATIONS

Singapore Search Report issued on Aug. 21, 2023 for Singapore Patent Application No. 11202202478U.

ISA State Intellectual Property Office of the People's Republic of China, Office Action of the International Searching Authority Issued on Aug. 14, 2024 for Chinese Patent Application No. 201980100442.4.

* cited by examiner

DISTRIBUTION OF SiCl₂ PARTIAL
PRESSURE ON WAFER

SUBSTRATE PROCESSING APPARATUS, ELEVATOR AND METHOD OF MANUFACTURING SEMICONDUCTOR DEVICE

CROSS-REFERENCE TO RELATED PATENT APPLICATION

This application is a bypass continuation application of PCT International Application No. PCT/JP2019/038175, filed on Sep. 27, 2019, in the WIPO, the entire contents of which are hereby incorporated by reference.

BACKGROUND

1. Field

The present disclosure relates to a substrate processing apparatus capable of processing a substrate in a manufacturing process of a semiconductor device, an elevator and a method of manufacturing a semiconductor device.

2. Related Art

In a heat treatment process of a substrate (also referred to as a "wafer") in a manufacturing process of a semiconductor device, for example, a substrate processing apparatus such as a vertical type substrate processing apparatus may be used. In the vertical type substrate processing apparatus, a plurality of substrates are charged into a substrate retainer of the vertical type substrate processing apparatus and supported in the vertical direction by the substrate retainer, and the substrate retainer is loaded into a process chamber of the vertical type substrate processing apparatus. Thereafter, a process gas is introduced into the process chamber while the process chamber is heated to perform a substrate processing such as a film-forming process on the plurality of substrates. For example, according to some related arts, a substrate processing apparatus provided with a gas ejection port through which a gas such as the process gas is ejected into the process chamber is disclosed. The gas ejection port is of a slot shape so as to span at least a plurality of substrates including the substrate in a direction perpendicular to a processing surface of the substrate.

SUMMARY

According to the present disclosure, there is provided a technique capable of improving a thickness uniformity of a film formed on each of a plurality of substrates when the plurality of substrates are processed simultaneously.

According to one or more embodiments of the present disclosure, there is provided a substrate processing apparatus including: a substrate retainer including: a substrate support configured to support a plurality of substrates at intervals in a vertical direction; and a partition plate support configured to support a plurality of partition plates arranged between the plurality of substrates supported by the substrate support; a reaction tube configured to accommodate the substrate retainer in which the plurality of substrates are supported by the substrate support; a first driver configured to move the substrate retainer in the vertical direction to transfer the substrate retainer into or out of the reaction tube; a second driver moved by the first driver in the vertical direction together with the substrate retainer, and configured to rotate the substrate retainer in a state where the substrate retainer is inserted in the reaction tube and to change a distance between each of the plurality of substrates supported by the substrate support and each of the plurality of partition plates supported by the partition plate support by moving at least one of the substrate support and the partition plate support in the vertical direction; a heater provided around the reaction tube and configured to heat the plurality of substrates; a gas supplier comprising a nozzle provided with a hole through which a gas is supplied to the plurality of substrates supported by the substrate support of the substrate retainer accommodated in the reaction tube; an exhauster through which the gas supplied through the gas supplier is exhausted out of the reaction tube; and a controller configured to be capable of controlling the first driver, the second driver and the gas supplier such that the gas is supplied to the plurality of substrates while changing, in accordance with pre-set conditions, at least one of a relative position of each of the plurality of substrates and a relative position of each of the plurality of partition plates with respect to the hole by driving the second driver in a state where the substrate retainer is inserted in the reaction tube by the first driver.

DETAILED DESCRIPTION

Figure 1:
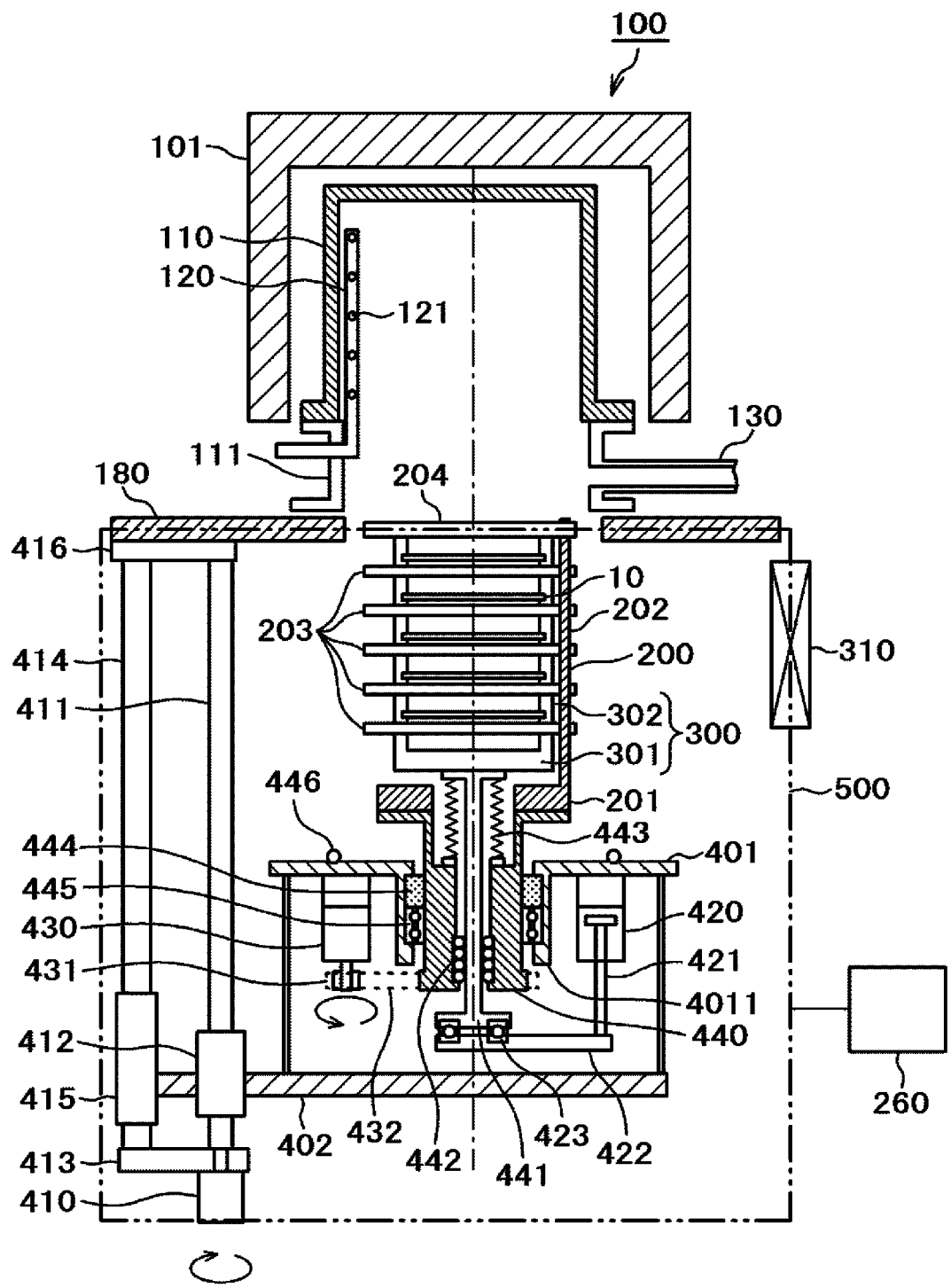
FIG. 1 is a cross-sectional view of a process chamber and a storage chamber schematically illustrating a state in which a boat in which a plurality of substrates are accommodated is transferred into a transfer chamber of a substrate processing apparatus according to a first embodiment of the present disclosure.

The present disclosure relates to a substrate processing apparatus including: a boat in which a plurality of substrates are accommodated; a plurality of partition plates configured separately from the boat and provided above the plurality of substrates accommodated in the boat, respectively; a partition plate support including a support configured to support the plurality of partition plates; a first elevator configured to elevate and lower the boat; and a second elevator configured to change a positional relationship between a substrate among the plurality of substrates and a partition plate among the plurality of partition plates in a vertical direction.

Hereinafter, one or more embodiments (also simply referred to as "embodiments") according to the technique of the present disclosure will be described with reference to the drawings. In the drawings for explaining the embodiments, like reference numerals represent like components, and redundant descriptions related thereto will be omitted in principle.

However, the technique of the present disclosure is not construed as being limited to the contents of the embodiments described below. Those skilled in the art will easily understand that specific configurations of the technique of the present disclosure can be changed without departing from the idea and the purpose of the technique of the present disclosure.

First Embodiment

A configuration of a substrate processing apparatus according to a first embodiment of the technique of the present disclosure will be described with reference to FIGS. 1 and 2.
<Substrate Processing Apparatus 100>

The substrate processing apparatus 100 includes: a reaction tube 110 of a cylindrical shape extending in the vertical direction; a heater 101 serving as a heating structure (furnace body) installed on an outer periphery of the reaction tube 110; and a gas supply nozzle 120 constituting a gas supplier (which is a gas supply structure or a gas supply system). For example, the heater 101 is constituted by a zone heater which is vertically divided into a plurality of heater structures (blocks) and a temperature of each heater structure can be set individually.

For example, the reaction tube 110 is made of a material such as quartz and silicon carbide (SiC). An inner atmosphere of the reaction tube 110 is exhausted by an exhaust component (not shown) through an exhaust pipe 130 constituting an exhauster (which is an exhaust structure or an exhaust system). An inside of the reaction tube 110 is hermetically sealed with respect to an outside air by a component such as a seal (not shown).

The technique of the present disclosure can also be applied when a second reaction tube (not shown) is provided at an inner side of the reaction tube 110 described herein.

The gas supply nozzle (hereinafter, also simply referred to as a "nozzle") 120 is provided with a plurality of holes including a hole 121 through which a gas is supplied into the reaction tube 110. Hereinafter, the plurality of holes including the hole 121 may also be referred to as "holes 121".

A source gas, a reactive gas and an inert gas (which is a carrier gas) are introduced into the reaction tube 110 through the holes 121 provided at the nozzle 120.

Flow rates of the source gas, the reactive gas and the inert gas (carrier gas) supplied from a source gas supply source (not shown), a reactive gas supply source (not shown) and an inert gas supply source (not shown), respectively, are adjusted by mass flow controllers (MFCs) (not shown), respectively, and then are supplied into the reaction tube 110 through the holes 121 provided at the nozzle 120.

The inner atmosphere of the reaction tube 110 is vacuum-exhausted by the exhaust component (not shown) through the exhaust pipe 130 provided at a manifold 111.
<Chamber 180>

A chamber 180 is provided under the reaction tube 110 via the manifold 111, and includes a storage chamber 500. In the storage chamber 500, a substrate 10 may be placed (mounted) on a substrate support (which is a boat) 300 by a transfer device (not shown) via a substrate loading/unloading port 310, or the substrate 10 is transferred from the substrate support (hereinafter, may also be simply referred to as the "boat") 300 by the transfer device.

In the present embodiment, the chamber 180 is made of a metal material such as stainless steel (SUS) and aluminum (Al).

Inside the chamber 180, a vertical driver 400 constituting a first driver capable of driving the substrate support (boat) 300, a partition plate support 200 or both of the substrate support (boat) 300 and the partition plate support 200 (collectively referred to as a "substrate retainer") in the vertical direction and a rotational direction is provided.
<Substrate Support Structure>

A substrate support structure is constituted by at least the substrate support (boat) 300. The substrate 10 is transferred into the storage chamber 500 by the transfer device (not shown) via the substrate loading/unloading port 310, and a process of forming a film on a surface of the substrate 10 is performed on the substrate 10 by further transferring the substrate 10 into the reaction tube 110. In addition, the substrate support structure may further include the partition plate support 200.

Figure 2:
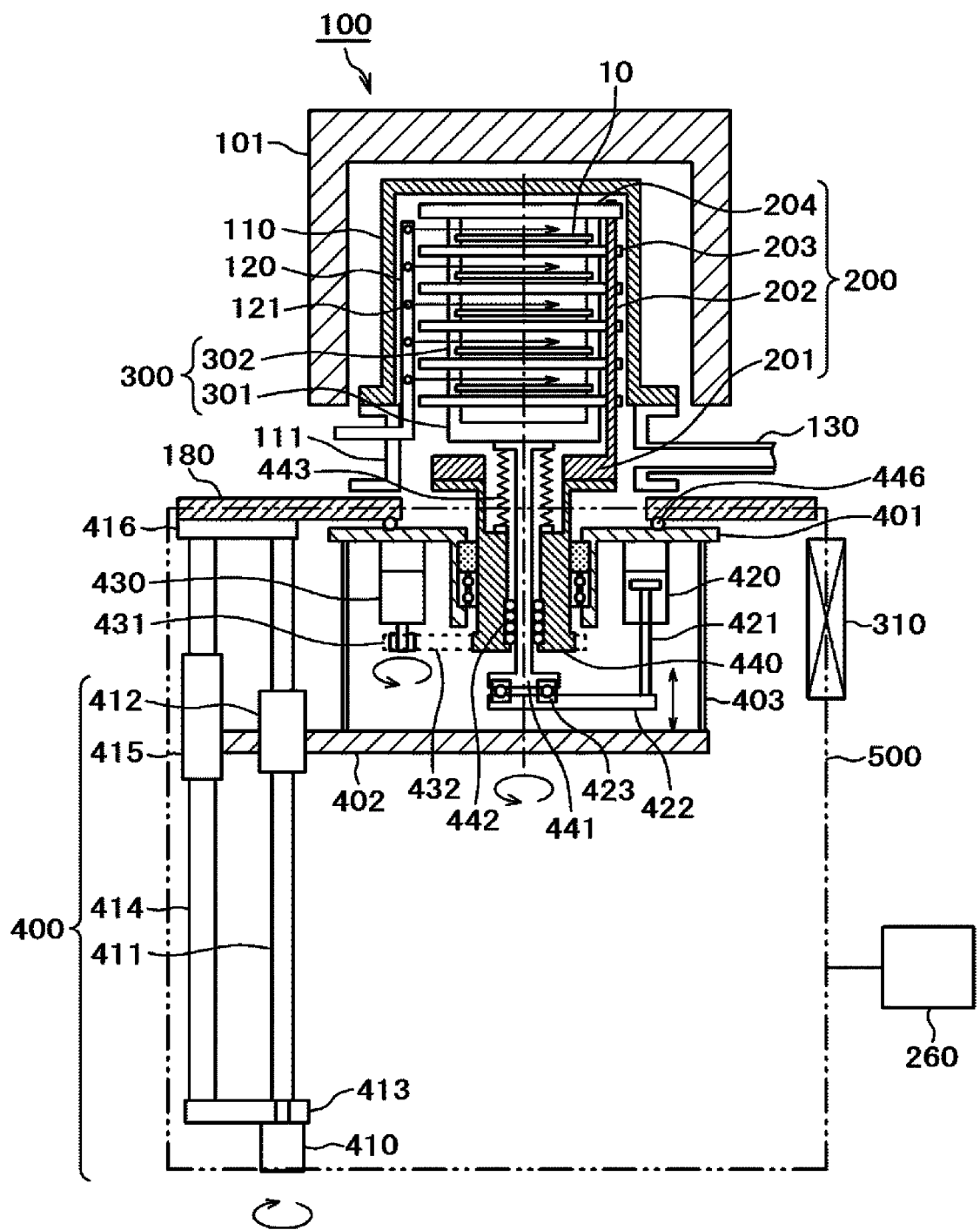
FIG. 2 is a cross-sectional view of the process chamber and the storage chamber schematically illustrating a state in which the boat in which the plurality of substrates are accommodated is elevated and transferred into the process chamber of the substrate processing apparatus according to the first embodiment.

As shown in FIGS. 1 and 2, in the partition plate support 200, a plurality of partition plates including a partition plate 203 of a disk shape are fixed at a predetermined pitch to a support column 202 supported between a base 201 and a top plate 204. Hereinafter, the plurality of partition plates including the partition plate 203 may also be referred to as "partition plates 203". As shown in FIGS. 1 and 2, the substrate support (boat) 300 includes a configuration in which a plurality of support rods 302 are supported at a base 301, and a plurality of substrates including the substrate 10 are supported by the plurality of support rods 302 at a predetermined interval. Hereinafter, the plurality of substrates including the substrate 10 may also be referred to as "substrates 10".

In the substrate support (boat) 300, the plurality of substrates 10 are supported at the predetermined interval by the plurality of support rods 302 at the base 301. The plurality of substrates 10 supported by the plurality of support rods 302 are partitioned by the plurality of partition plates 203 of a disk shape fixed (supported) to the support columns 202 supported by the partition plate support 200 at a predetermined pitch (interval). According to the present embodiment, the partition plate 203 is arranged on either or both of an upper portion and a lower portion of the substrate 10.

The predetermined interval between the plurality of substrates 10 accommodated in the substrate support (boat) 300 is the same as a vertical pitch (interval) of the partition plates 203 fixed to the partition plate support 200. Further, a diameter of the partition plate 203 is set to be greater than a diameter of the substrate 10.

The boat 300 is configured to support the substrates (for example, five substrates) 10 by the plurality of support rods 302 in a multistage manner in the vertical direction. For example, a vertical interval (distance) between the substrates 10 supported in a multistage manner in the vertical direction is set to about 60 mm. For example, the base 301 and the plurality of support rods 302, which constitute the boat 300, are made of a material such as quartz and SiC. Further, while the present embodiment will be described by way of an example in which the five substrates 10 are supported in the boat 300, the present embodiment is not limited thereto. For example, the boat 300 may be configured to support about 5 substrates to 50 substrates as the substrates 10. In addition, the partition plates 203 of the partition plate support 200 may also be referred to as "separators".

The partition plate support 200 and the substrate support (boat) 300 are moved (driven) by the vertical driver 400 in the vertical direction between the reaction tube 110 and the storage chamber 500 and in the rotational direction around a center of the substrate 10 supported by the substrate support (boat) 300.

As shown in FIGS. 1 and 2, the vertical driver 400 constituting the first driver includes a vertical driving motor 410, a rotational driving motor 430, which serve as driving sources, and a boat vertical driver 420 provided with a linear actuator serving as a substrate support elevator capable of driving the substrate support (boat) 300 in the vertical direction.

The vertical driving motor 410 serving as a partition plate support elevator is configured to rotationally drive a ball screw 411 to move a nut 412 screwed to the ball screw 411 in the vertical direction along the ball screw 411. As a result, the partition plate support 200 and the substrate support (boat) 300 are driven in the vertical direction between the reaction tube 110 and the storage chamber 500 together with a base plate 402 fixing the nut 412. The base plate 402 is also fixed to a ball guide 415 engaged with a guide shaft 414, and is configured to be capable of moving smoothly in the vertical direction along the guide shaft 414. Upper ends and lower ends of the ball screw 411 and the guide shaft 414 are fixed to fixing plates 413 and 416, respectively. In addition, the partition plate support elevator may include a structure for transmitting the power of the vertical driving motor 410.

The rotational driving motor 430 and the boat vertical driver 420 provided with the linear actuator constitute a second driver, and are fixed to a base flange 401 serving as a lid supported by a side plate 403 at the base plate 402. By using the side plate 403, it is possible to suppress a diffusion of particles generated by a component such as a vertical driver such as the boat vertical driver 420 and a rotator (which is a rotating structure) such as the rotational driving motor 430. The side plate 403 is of a cover shape (in a cylindrical shape or a columnar shape) so as to cover the component such as the vertical driver and the rotator. A hole (not shown) through which a transfer chamber is in communication with the side plate 403 of the cover shape is provided at the side plate 403 on a part of the side plate 403 or on a bottom surface of the side plate 403. By the hole through which the transfer chamber is in communication with the side plate 403 of the cover shape, an inner pressure of the side plate 403 of the cover shape can be set to be substantially equal to an inner pressure of the transfer chamber.

On the other hand, a support column may be used instead of the side plate 403. In such a case, it is possible to easily perform a maintenance operation on the component such as the vertical driver and the rotator.

The rotational driving motor 430 is configured to drive a rotation transmission belt 432 engaging with a tooth portion 431 attached to a front end (tip) of the rotational driving motor 430, and to rotate (rotationally drive) a support 440 engaging with the rotation transmission belt 432. The support 440 is configured to support the partition plate support 200 by the base 201, and to be driven by the rotational driving motor 430 via the rotation transmission belt 432 to rotate the partition plate support 200 and the boat 300.

The support 440 is separated from an inner cylinder portion 4011 of the base flange 401 by a vacuum seal 444, and a lower portion thereof is rotatably guided with respect to the inner cylinder portion 4011 of the base flange 401 by a bearing 445.

The boat vertical driver 420 provided with the linear actuator is configured to drive a shaft 421 in the vertical direction. A plate 422 is attached to a front end (tip) of the shaft 421. The plate 422 is connected to a support structure 441 fixed to the base 301 of the boat 300 via a bearing 423. By connecting the support structure 441 to the plate 422 via the bearing 423, it is possible to rotate the boat 300 together with the partition plate support 200 when the partition plate support 200 is rotated (rotationally driven) by the rotational driving motor 430.

On the other hand, the support structure 441 is supported by the support 440 via a linear guide bearing 442. With such a configuration, when the shaft 421 is driven in the vertical direction by the boat vertical driver 420 provided with the linear actuator, it is possible to drive the support structure 441 fixed to the boat 300 relatively in the vertical direction with respect to the support 440 fixed to the partition plate support 200.

By configuring the support 440 and the support structure 441 concentrically as described above, it is possible to simplify a structure of the rotator using the rotational driving motor 430. Further, it is possible to easily control a synchronization of a rotation between the boat 300 and the partition plate support 200.

However, the present embodiment is not limited thereto, and the support 440 and the support structure 441 may be arranged separately rather than concentrically.

The support 440 fixed to the partition plate support 200 and the support structure 441 fixed to the boat 300 are connected by a vacuum bellows 443.

An O-ring 446 for vacuum sealing is installed on an upper surface of the base flange 401 serving as the lid, and as shown in FIG. 2, by driving the vertical driving motor 410 to elevate the upper surface of the base flange 401 to a position where the upper surface of the base flange 401 is pressed against the chamber 180, it is possible to airtightly maintain the inside of the reaction tube 110.

The O-ring 446 for vacuum sealing may be omitted, and by pressing the upper surface of the base flange 401 against the chamber 180 without using the O-ring 446 for vacuum sealing, it is possible to airtightly maintain the inside of the reaction tube 110. Further, the vacuum bellows 443 may be omitted.

In the configuration described above, by driving the vertical driving motor 410 to elevate the upper surface of the base flange 401 until the upper surface of the base flange 401 is pressed against the chamber 180 as shown in FIG. 2 such that the substrate support structure is inserted into the reaction tube 110, the source gas, the reactive gas or the inert gas (carrier gas) is introduced into the reaction tube 110 through the holes 121 provided at the gas supply nozzle 120.

A pitch of the holes 121 provided at the gas supply nozzle 120 is substantially the same as the vertical interval of the substrates 10 accommodated in the boat 300 and the vertical pitch (interval) of the partition plates 203 fixed to the partition plate support 200.

According to the present embodiment, when the upper surface of the base flange 401 is pressed against the chamber 180, a height position (that is, a position in the vertical direction) of the partition plates 203 fixed to the support column 202 of the partition plate support 200 is fixed, and a height position of the substrate 10 supported by the boat 300 with respect to the partition plate 203 may be changed by driving the boat vertical driver 420 provided with the linear actuator so as to elevate or lower the support structure 441 fixed to the base 301 of the boat 300. Since a position of the hole 121 provided at the gas supply nozzle 120 is also fixed, the height position (relative position) of the substrate 10 supported by the boat 300 with respect to the hole 121 may also be changed.

Figure 3A:
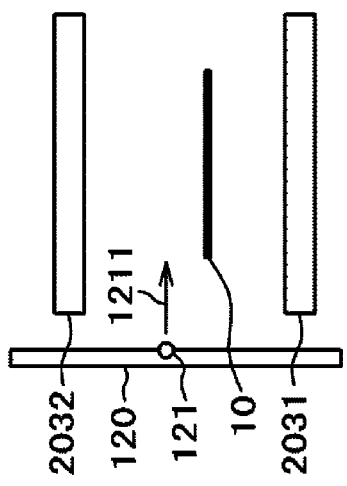
FIGS. 3A through 3C are cross-sectional views of a substrate and a partition plate schematically illustrating a distance between the substrate and the partition plate in the process chamber of the substrate processing apparatus according to the first embodiment.
Figure 3B:
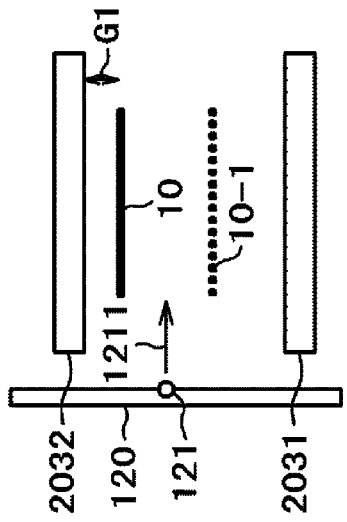
Figure 3C:
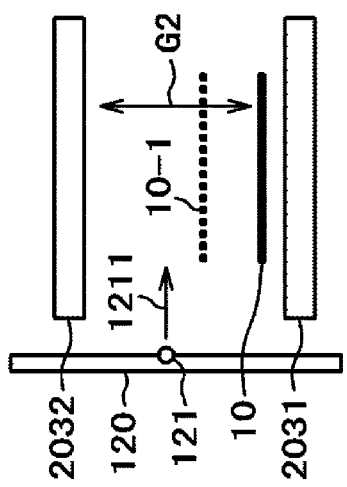

That is, by adjusting the position (height position) of the substrate 10 supported by the boat 300 in the vertical direction by driving the boat vertical driver 420 provided with the linear actuator with respect to a reference positional relationship of a transfer operation as shown in FIG. 3A, it is possible to adjust positional relationships of the substrate 10 with respect to the hole 121 provided at the nozzle 120 and the partition plate 203 such that a distance between an upper partition plate 2032 and the substrate 10 is narrowed (that is, a narrowed gap G1 is formed between the upper partition plate 2032 and the substrate 10) as shown in FIG. 3B by setting the position of the substrate 10 to be higher than a transfer position (home position) 10-1, or such that the distance between the upper partition plate 2032 and the substrate 10 is widened (that is, a widened gap G2 is formed between the upper partition plate 2032 and the substrate 10) as shown in FIG. 3C by setting the position of the substrate 10 to be lower than the transfer position (home position) 10-1.

By changing the position of the substrate 10 with respect to the hole 121 provided at the nozzle 120 as described above, it is possible to change a positional relationship between a gas flow 1211 ejected through the hole 121 and the substrate 10.

Figure 4:
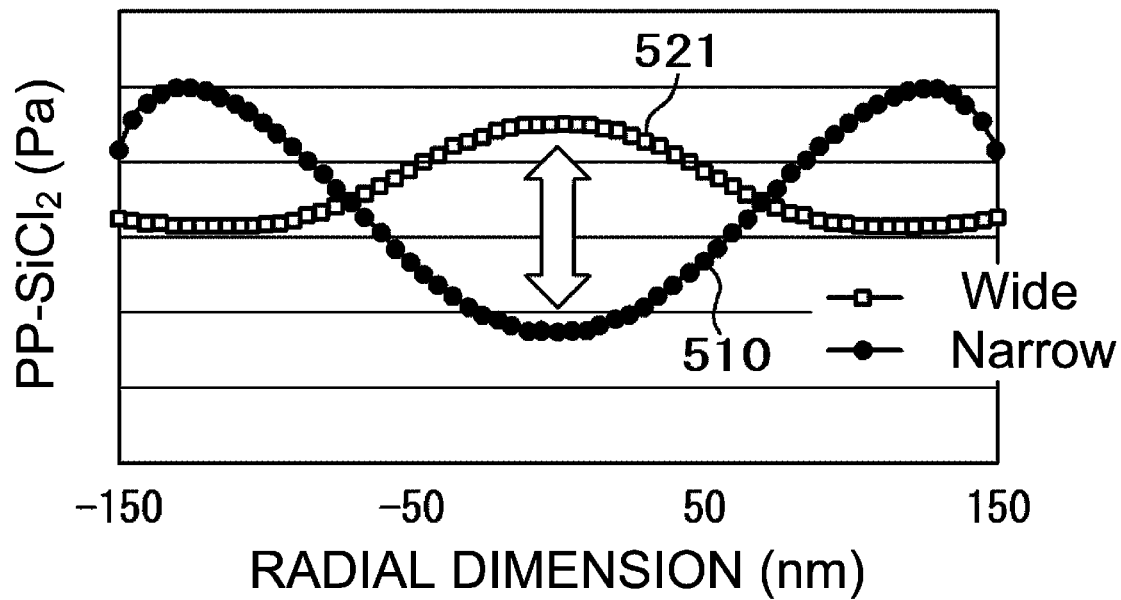
FIG. 4 is a graph schematically illustrating a distribution of a concentration of a material gas on a surface of the substrate when the distance between the substrate and the partition plate is switched in the process chamber of the substrate processing apparatus according to the first embodiment.

FIG. 4 schematically illustrates a simulation result of a distribution of the film formed on the surface of the substrate 10 (or a distribution of a concentration of a material gas such as silicon dichloride gas ($SiCl_2$ gas) on the surface of the substrate 10) when the $SiCl_2$ gas is supplied through the hole 121 provided at the nozzle 120 in a state in which the position of the substrate 10 is elevated to form the narrowed gap G1 between the substrate 10 and the upper partition plate 2032 as shown in FIG. 3B and a state in which the position of the substrate 10 is lowered to form the widened gap G2 between the substrate 10 and the upper partition plate 2032 as shown in FIG. 3C.

A point sequence 510 indicated by "Narrow" in FIG. 4 schematically illustrates a case where the film is formed in the state shown in FIG. 3B, that is, the state in which the position of the substrate 10 is elevated to form the narrowed gap G1 between the substrate 10 and the upper partition plate 2032, and the position of the substrate 10 is set to be higher than a position of the gas flow 1211 ejected through the hole 121. In such a case, a relatively thick film is formed on a peripheral portion of the substrate 10. As a result, it is possible to obtain a concave thickness distribution of the film in which a thickness of the film formed on a central portion of the substrate 10 is thinner than that of the film formed on the peripheral portion of the substrate 10.

On the other hand, a point sequence 521 indicated by "Wide" in FIG. 4 schematically illustrates a case where the film is formed in the state shown in FIG. 3C, that is, the state in which the position of the substrate 10 is lowered to form the widened gap G2 between the substrate 10 and the upper partition plate 2032, and the position of the substrate 10 is set to be lower than the position of the gas flow 1211 ejected through the hole 121. In such a case, it is possible to obtain a convex thickness distribution of the film in which the film is relatively thicker on the central portion of the substrate 10 than on the peripheral portion of the substrate 10.

It can be seen that, by changing the position of the substrate 10 as described above, the distribution of the film formed on the surface of the substrate 10 can be changed.

Figure 5:
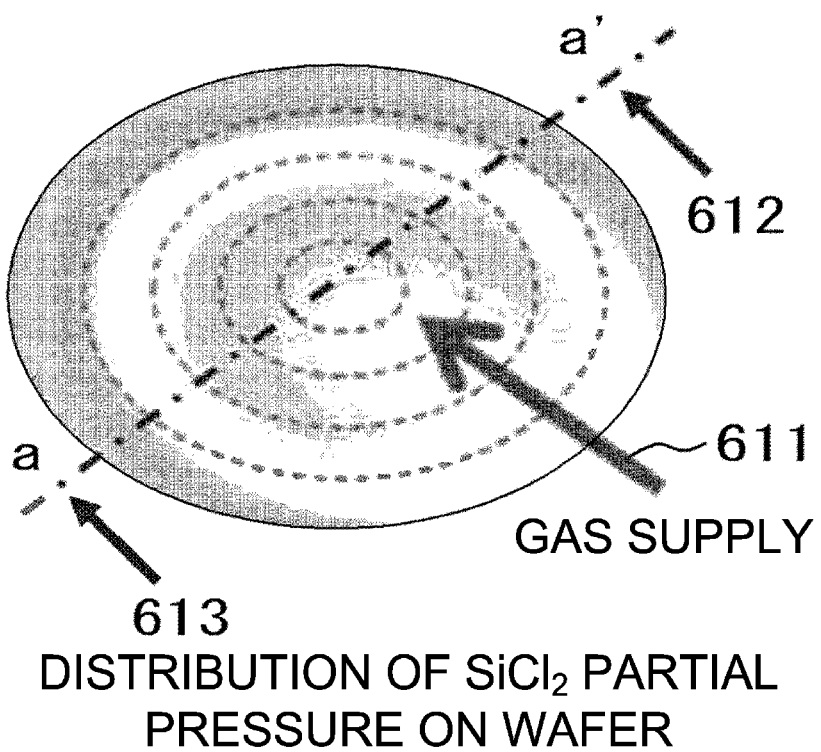
FIG. 5 is a perspective view of the substrate schematically illustrating the distribution of the concentration of the material gas on the surface of the substrate when the distance between the substrate and the partition plate is set to a long distance as shown in FIG. 3C, in a diagram schematically visualizing the distribution of the concentration of the material gas on the surface of the substrate in the process chamber of the substrate processing apparatus according to the first embodiment.

FIG. 5 schematically illustrates a simulation result of a distribution of a partial pressure of the $SiCl_2$ gas (or the distribution of the concentration of the $SiCl_2$ gas) on the surface of the substrate 10 when the silicon dichloride gas ($SiCl_2$ gas) is supplied along a direction of an arrow 611 in a case where the positional relationships of the substrate 10 with respect to the upper partition plate 2032 and the hole 121 provided at the nozzle 120 are set as shown in FIG. 3C. The thickness distribution of the film in FIG. 4 corresponds to the thickness distribution of the film in a cross-section taken along the line a-a' of FIG. 5.

As shown in FIG. 5, when the positional relationships of the substrate 10 with respect to the upper partition plate 2032 and the hole 121 provided in the nozzle 120 are set as shown in FIG. 3C, the partial pressure of the $SiCl_2$ gas is relatively high in portions illustrated in dark color on the substrate 10 extending from a portion close to the hole 121 provided at the nozzle 120 to the central portion of the substrate 10. On the other hand, the partial pressure of the $SiCl_2$ gas is relatively low in the peripheral portion of the substrate 10 far from the hole 121 provided at the nozzle 120.

In such a state, by rotationally driving the support 440 by driving the rotational driving motor 430 so as to rotate the partition plate support 200 and the boat 300, the substrate 10 accommodated in the boat 300 are rotated. Thereby, it is possible to reduce a variation in the thickness of the film (in the thickness distribution of the film) in a circumferential direction of the substrate 10.

<Controller>

As shown in FIG. 1, the substrate processing apparatus 100 is connected to a controller 260 configured to control operations of components constituting the substrate processing apparatus 100.

Figure 6:
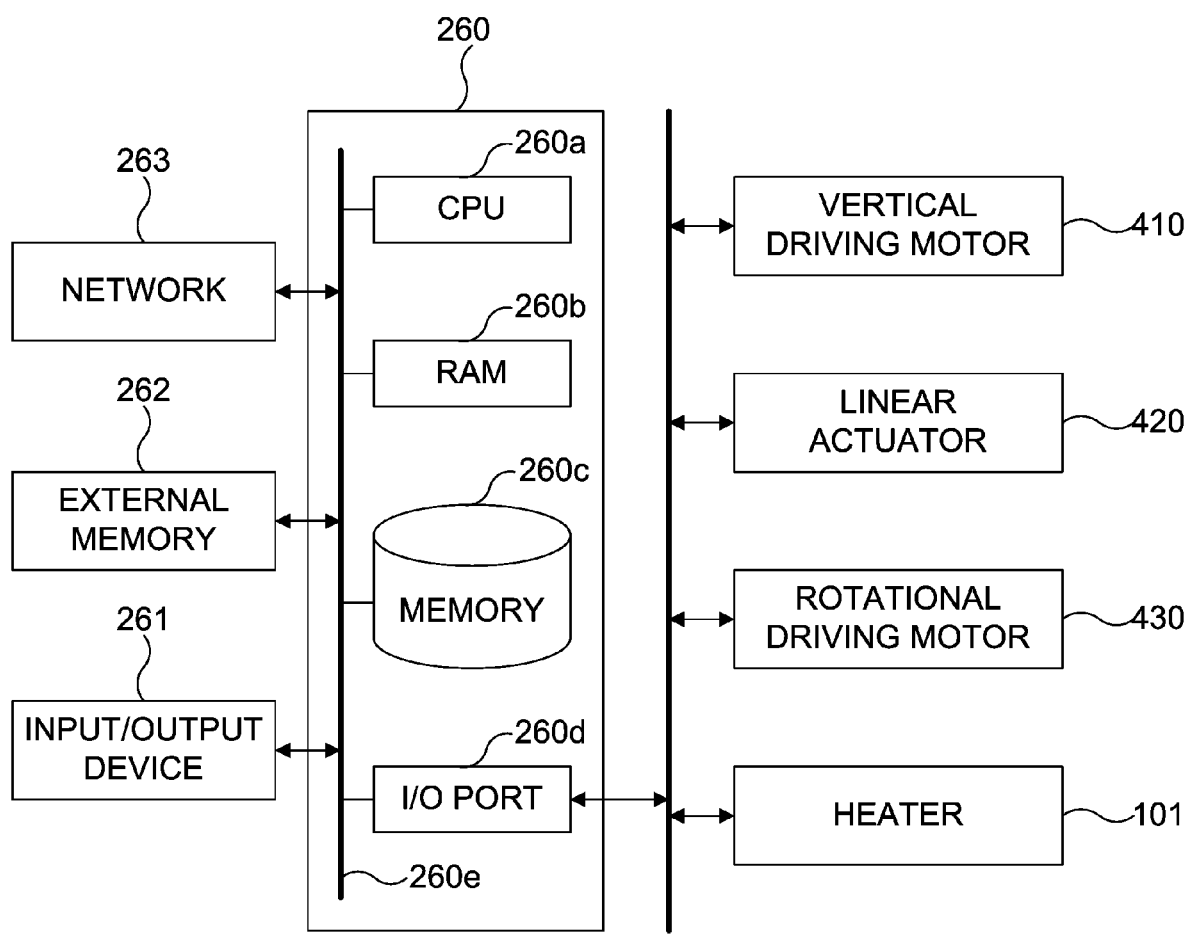
FIG. 6 is a block diagram schematically illustrating an exemplary configuration of a controller and related components of the substrate processing apparatus according to the first embodiment.

The controller 260 is schematically illustrated in FIG. 6. The controller 260 serving as a control apparatus (control structure) is constituted by a computer including a CPU (Central Processing Unit) 260a, a RAM (Random Access Memory) 260b, a memory 260c and an I/O port 260d. The RAM 260b, the memory 260c and the I/O port 260d may exchange data with the CPU 260a through an internal bus 260e. For example, an input/output device 261 configured by a component such as a touch panel and an external memory 262 may be connected to the controller 260.

The memory 260c is configured by a component such as a flash memory and a hard disk drive (HDD). For example, a control program configured to control the operation of the substrate processing apparatus 100, a process recipe containing information on sequences and conditions of a substrate processing described later, or a database may be readably stored in the memory 260c.

The process recipe is obtained by combining steps of the substrate processing described later such that the controller 260 can execute the steps to acquire a predetermined result, and functions as a program.

Hereafter, the process recipe and the control program may be collectively or individually referred to as a "program". Thus, in the present specification, the term "program" may refer to the process recipe alone, may refer to the control program alone, or may refer to both of the process recipe and the control program. In addition, the RAM 260b functions as a memory area (work area) where a program or data read by the CPU 260a is temporarily stored.

The I/O port 260d is electrically connected to the components such as the substrate loading/unloading port 310, the vertical driving motor 410, the boat vertical driver 420 provided with the linear actuator, the rotational driving motor 430, the heater 101, the mass flow controllers (not shown), a temperature regulator (not shown) and a vacuum pump (not shown).

In addition, in the present specification, "electrically connected" means that the components are connected by physical cables or the components are capable of communicating with one another to transmit and receive signals (electronic data) to and from one another directly or indirectly. For example, a device for relaying the signals or a device for converting or computing the signals may be provided between the components.

The CPU 260a is configured to read and execute the control program from the memory 260c and read the process recipe from the memory 260c in accordance with an instruction such as an operation command inputted from the controller 260. The CPU 260a is configured to be capable of controlling various operations in accordance with the process recipe such as an opening and closing operation of the substrate loading/unloading port 310, a driving operation of the vertical driving motor 410, a driving operation of the boat vertical driver 420 provided with the linear actuator, a rotating operation of the rotational driving motor 430 and an operation of supplying electrical power to the heater 101.

The controller 260 is not limited to a dedicated computer, and the controller 260 may be embodied by a general-purpose computer. For example, the controller 260 according to the present embodiment may be embodied by preparing the external memory 262 (e.g., a magnetic tape, a magnetic disk such as a flexible disk and a hard disk, an optical disk such as a CD and a DVD, a magneto-optical disk such as an MO, a semiconductor memory such as a USB memory and a memory card) in which the above-described program is stored, and installing the program onto the general-purpose computer using the external memory 262.

The method of providing the program to the computer is not limited to the external memory 262. For example, the program may be directly provided to the computer by a communication instrument such as a network 263 (Internet and a dedicated line) instead of the external memory 262. The memory 260c and the external memory 262 may be embodied by a non-transitory computer-readable recording medium. Hereinafter, the memory 260c and the external memory 262 are collectively or individually referred to as a recording medium. Thus, in the present specification, the term "recording medium" may refer to the memory 260c alone, may refer to the external memory 262 alone, or may refer to both of the memory 260c and the external memory 262.

<Substrate Processing (Film-forming Process)>

Figure 7:
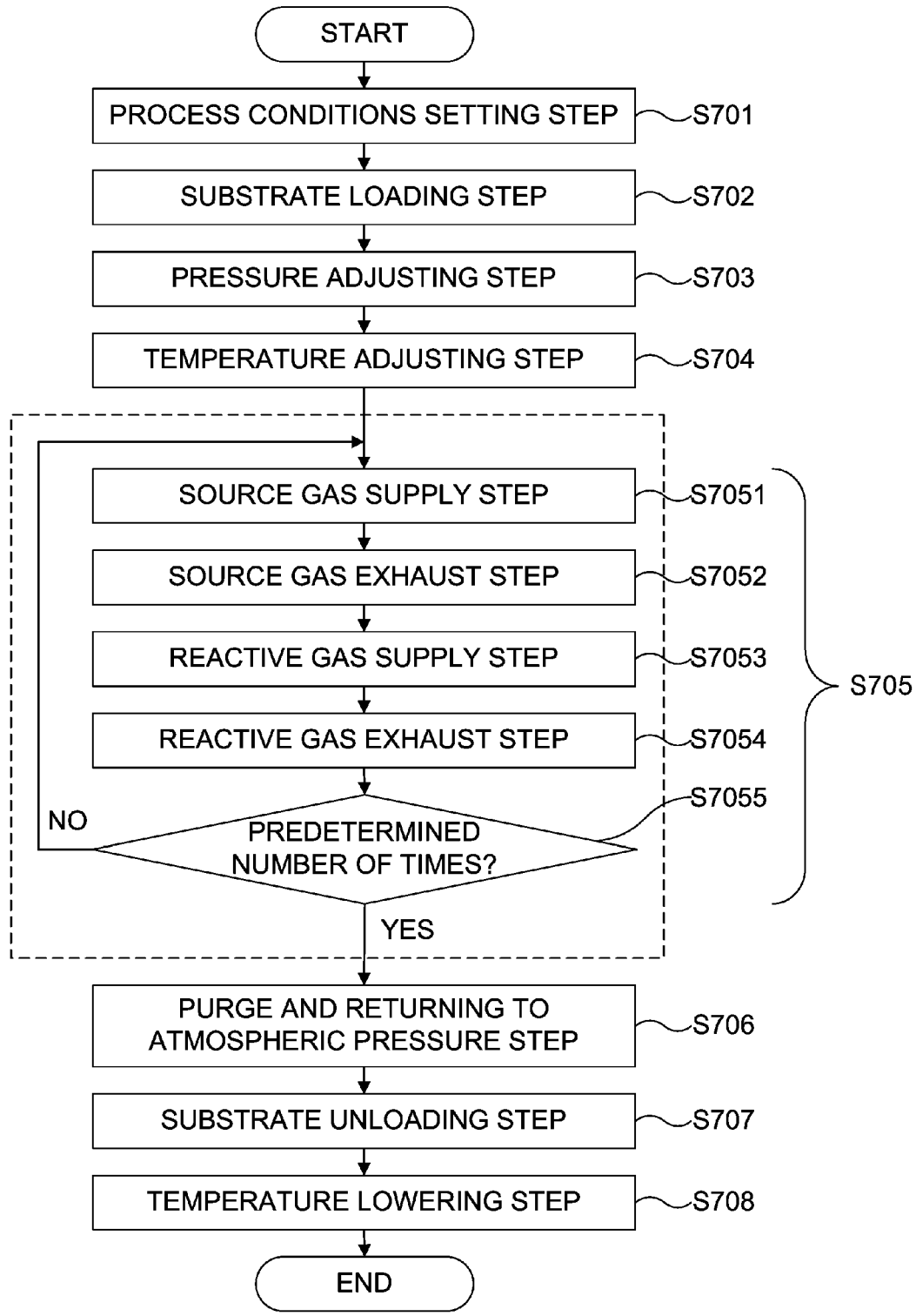
FIG. 7 is a flow chart schematically illustrating a manufacturing process of a semiconductor device according to the first embodiment.

Hereinafter, the substrate processing (film-forming process) of forming the film on the substrate 10 using the substrate processing apparatus 100 described with reference to FIGS. 1 and 2 will be described with reference to FIG. 7.

Although the technique of the present disclosure can be applied to one or both of the film-forming process and an etching process, the present embodiment will be described based on a step of forming a silicon oxide ($SiO_2$) film on the substrate 10, which is an example of a step of forming the film, as a part of a manufacturing process of a semiconductor device. The step of forming the film such as the $SiO_2$ film is performed in the reaction tube 110 of the substrate processing apparatus 100 described above. As described above, by executing the program by the CPU 260a of the controller 260 of FIG. 6, the manufacturing process is performed.

In the substrate processing (the manufacturing process of the semiconductor device) according to the present embodiment, first, by driving the vertical driving motor 410 to elevate the upper surface of the base flange 401 until the upper surface of the base flange 401 is pressed against the chamber 180 as shown in FIG. 2, the substrate support structure is inserted into the reaction tube 110.

Subsequently, in such a state, by driving the shaft 421 in the vertical direction by the boat vertical driver 420 provided with the linear actuator, the height (distance) of the substrate 10 accommodated in the boat 300 with respect to the partition plate 203 can be set from an initial state shown in FIG. 3A to a state in which the narrowed gap G1 is formed between the partition plate 203 and the substrate 10 as shown in FIG. 3B by elevating the substrate 10 or to a state in which the widened gap G2 is formed between the partition plate 203 and the substrate 10 as shown in FIG. 3C by lowering the substrate 10. Thereby, the height of the substrate 10 with respect to the partition plate 203 (that is, the distance between the partition plate 203 and the substrate 10) is adjusted to a desired value.

In such a state, the step of forming the $SiO_2$ film including: (a) a step of supplying $Si_2Cl_6$ (disilicon hexachloride) gas through the gas supply nozzle 120 to the substrate 10 accommodated in the reaction tube 110; (b) a step of removing a residual gas in the reaction tube 110; (c) a step of supplying $O_2$ (oxygen) (or $O_3$ (ozone) or $H_2O$ (water)) through the gas supply nozzle 120 to the substrate 10 accommodated in the reaction tube 110; and (d) a step of removing a residual gas in the reaction tube 110 is performed. The steps (a) to (d) described above are performed a plurality of times to form the $SiO_2$ film on the substrate 10.

Further, while the steps (a) to (d) are performed the plurality of times or in the steps (a) and (c) described above, with rotationally driving the support 440 connected to the rotational driving motor 430 through the rotation transmission belt 432 by the rotational driving motor 430, the height (distance) of the substrate 10 with respect to the partition plate 203 is periodically changed between the state in which the narrowed gap G1 is formed between the partition plate 203 and the substrate 10 as shown in FIG. 3B by elevating the substrate 10 and the state in which the widened gap G2 is formed between the partition plate 203 and the substrate 10 as shown in FIG. 3C by lowering the substrate 10. As a result, it is possible to uniformize the thickness of the film (that is, the $SiO_2$ film) formed on the surface of the substrate 10.

Further, in the present specification, the term "substrate" may refer to "a substrate itself" or may refer to "a substrate and a stacked structure (aggregated structure) of predetermined layers or films formed on a surface of the substrate". That is, the term "substrate" may collectively refer to the substrate and the layers or the films formed on the surface of the substrate. In addition, in the present specification, the term "a surface of a substrate" may refer to "a surface (exposed surface) of a substrate itself" or may refer to "a surface of a predetermined layer or a film formed on the substrate, i.e. a top surface (uppermost surface) of the substrate as the stacked structure". In addition, in the present specification, the terms "substrate" and "wafer" may be used as substantially the same meaning.

Subsequently, a specific example of the film-forming process will be described with reference to a flow chart shown in FIG. 7.

<Process Conditions Setting Step: S701>

First, the CPU 260a reads the process recipe and the related database stored in the memory 260c and sets process conditions. Instead of the memory 260c, the process recipe and the related database may be obtained via the network.

Figure 8:
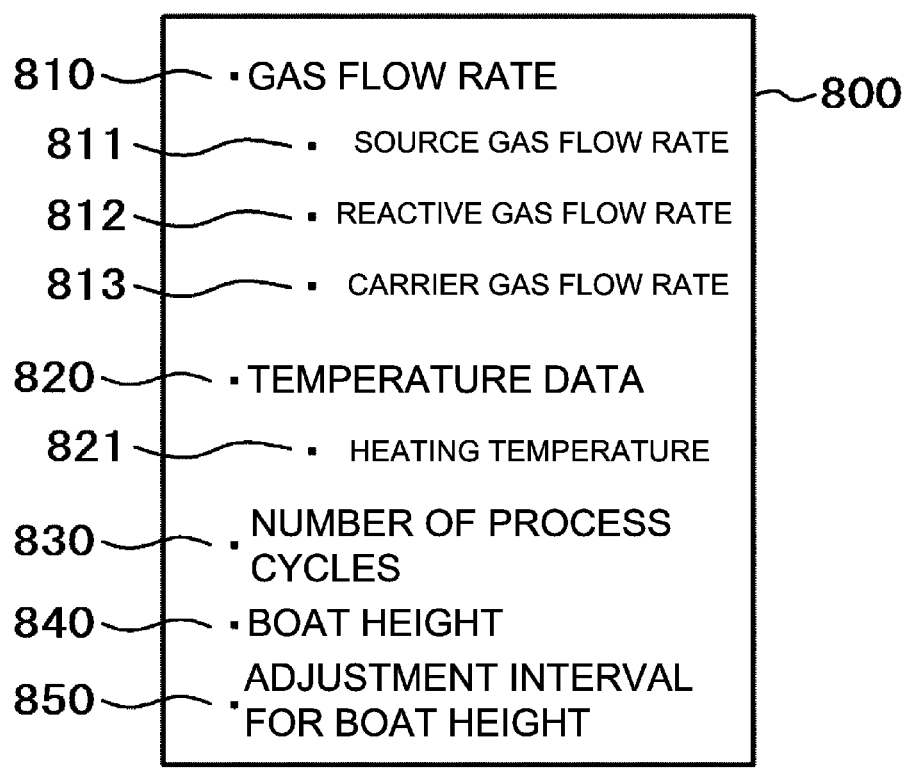
FIG. 8 is a table schematically illustrating an exemplary list of items in a process recipe read by a CPU of the substrate processing apparatus according to the first embodiment.

FIG. 8 schematically illustrates an example of a process recipe 800 read by the CPU 260a. The process recipe 800 may include main items such as a "gas flow rate" 810, a "temperature data" 820, the "number of process cycles" 830, a "boat height" 840 and an "adjustment interval" 850 for the boat height.

The gas flow rate 810 may include items such as a "source gas flow rate" 811, a "reactive gas flow rate" 812 and a "carrier gas flow rate" 813. The temperature data 820 may include an item such as a "heating temperature" 821 in the reaction tube 110 by the heater 101.

The boat height 840 may include items such as preset values of a minimum value (that is, the narrowed gap G1) and a maximum value (that is, the widened gap G2) of the distance between the substrate 10 and the partition plate 203 described with reference to FIGS. 3B and 3C.

The adjustment interval 850 for the boat height may include an item such as a switching time interval between a time duration of maintaining the distance between the substrate 10 and the partition plate 203 at the minimum value as shown in FIG. 3B and a time duration of maintaining the distance between the substrate 10 and the partition plate 203 at the maximum value as shown in FIG. 3C. That is, the film is formed on the substrate 10 by processing the substrate 10 while alternately switching between the case in which the distance between the surface of the substrate 10 and the partition plate 203 (that is, the position of the substrate 10 with respect to the position of the hole 121 of the gas supply nozzle 120) is set as shown in FIG. 3B and the case in which the distance between the surface of the substrate 10 and the partition plate 203 is set as shown in FIG. 3C. As a result, it is possible to form the film such that a flat thickness distribution of the film in which the thickness of the film formed on the central portion on the surface of the substrate 10 is substantially the same as that of the film formed on the outer peripheral portion on the surface of the substrate 10 can be obtained.

<Substrate Loading Step: S702>

With the boat 300 accommodated in the storage chamber 500, the vertical driving motor 410 is driven to rotationally drive the ball screw so as to transfer the boat 300 by pitch feeding such that new substrates including a new substrate 10 are transferred (loaded or charged) into the boat 300 one by one through the substrate loading/unloading port 310 of the storage chamber 500. Hereinafter, the new substrates including the new substrate 10 may also be simply referred to as "new substrates 10" or "substrates 10", and the new substrate 10 may also be simply referred to as the "substrate 10".

When the charging of the new substrates 10 into the boat 300 is completed, by driving the vertical driving motor 410 to rotationally drive the ball screw 411 in a state where the substrate loading/unloading port 310 is closed and an inside of the storage chamber 500 is hermetically sealed with respect to an outside of the storage chamber 500, the boat 300 is elevated. As a result, the boat 300 is transferred (loaded) into the reaction tube 110 from the storage chamber 500.

When the boat 300 is being loaded, the height of the boat 300 elevated by the vertical driving motor 410 is set based on the process recipe read in the step S701 such that a positional difference between the substrate 10 accommodated in the boat 300 and an ejection position (which corresponds to the height of the front end of the nozzle 120) of the gas supplied into the reaction tube 110 through the nozzle 120 via a hole (not shown) provided in a tube wall of the reaction tube 110 can be set as shown in FIG. 3B or FIG. 3C.

<Pressure Adjusting Step: S703>

With the boat 300 loaded in the reaction tube 110, the inner atmosphere of the reaction tube 110 is vacuum-exhausted by the vacuum pump (not shown) through the exhaust pipe 130 such that an inner pressure of the reaction tube 110 reaches and is maintained at a desired pressure.

<Temperature Adjusting Step: S704>

In a state where the inner atmosphere of the reaction tube 110 is vacuum-exhausted by the vacuum pump (not shown), the heater 101 heats the reaction tube 110 based on the recipe read in the step S701 such that an inner temperature of the reaction tube 110 reaches and is maintained at a desired temperature. When heating the reaction tube 110, an amount of the electric current supplied to the heater 101 is feedback-controlled based on temperature information detected by a temperature sensor (not shown) such that a desired temperature distribution of the inner temperature of the reaction tube 110 can be obtained. The heater 101 continuously heats the reaction tube 110 until at least a processing of the substrate 10 is completed. Further, when a temperature of the substrate 10 is elevated by heating by the heater 101, the pitch (that is, a distance between a back surface of the substrate 10 and the partition plate 203 below the substrate 10) is narrowed (the state shown in FIG. 3C). Narrowing the pitch is performed at least before a supply of the source gas. After the supply of the source gas, the pitch is widened. In addition, the pitch during the supply of the source gas may be set to be different from the pitch during a supply of the reactive gas. Further, the pitch may be changed during the supply of the source gas (or the reactive gas). In addition, an operation timing at which the substrate support 300 and the partition plate support 200 move relatively in the vertical direction can be set appropriately.

<SiO₂ Film Forming Step: S705>

Subsequently, a step of forming the film such as the $SiO_2$ film serving as a first film (that is, the $SiO_2$ film forming step) is performed. For example, a source gas supply step S7051, a source gas exhaust step S7052, a reactive gas supply step S7053, a reactive gas exhaust step S7054 and a determination step S7055 are performed as the $SiO_2$ film forming step S705.

<Source Gas Supply Step S7051>

First, by rotationally driving the rotational driving motor 430 to rotate the support 440 via the rotation transmission belt 432, the partition plate support 200 and the boat 300 supported by the support 440 are rotated.

While the boat 300 is being rotated, the $Si_2Cl_6$ gas serving as the source gas whose flow rate is adjusted is supplied into the reaction tube 110 through the hole 121 of the nozzle 120. A part of the source gas supplied into the reaction tube 110, which did not contribute to a reaction on the surface of the substrate 10, is exhausted through the exhaust pipe 130.

In the source gas supply step S7051, by elevating and lowering the boat 300 at a predetermined time interval by operating the boat vertical driver 420 provided with the linear actuator to drive the shaft 421 in the vertical direction based on the process recipe read in the step S701, the relative position (height position) of the surface of the substrate 10 accommodated in the boat 300 with respect to the hole 121 of the nozzle 120 and the partition plate 203 of the partition plate support 200 can be switched between a plurality of positions (for example, the position shown in FIG. 3B and the position shown in FIG. 3C).

By introducing the $Si_2Cl_6$ gas into the reaction tube 110 through the hole 121 of the nozzle 120, the $Si_2Cl_6$ gas is supplied to the substrate 10 accommodated in the boat 300. For example, the flow rate of the $Si_2Cl_6$ gas supplied into the reaction tube 110 may be set within a range from 0.002 slm (standard liter per minute) to 1 slm, and more preferably, within a range from 0.1 slm to 1 slm.

When supplying the $Si_2Cl_6$ gas, as the carrier gas, the inert gas such as nitrogen ($N_2$) gas and argon (Ar) gas is supplied into the reaction tube 110 together with the $Si_2Cl_6$ gas, and is exhausted through the exhaust pipe 130. Specifically, a flow rate of the carrier gas may be set within a range from 0.01 slm to 5 slm, and more preferably, within a range from 0.5 slm to 5 slm.

The carrier gas such as the $N_2$ gas is supplied into the reaction tube 110 through the nozzle 120, and is exhausted through the exhaust pipe 130. When the carrier gas is supplied and exhausted, a temperature of the heater 101 is set such that the temperature of the substrate 10 is within a range from, for example, 250° C. to 550° C.

In the source gas supply step S7051, the $Si_2Cl_6$ gas and the carrier gas such as the $N_2$ gas are supplied into the reaction tube 110 without any other gas being supplied into the reaction tube 110 together with the $Si_2Cl_6$ gas and the carrier gas. By supplying the $Si_2Cl_6$ gas into the reaction tube 110, a silicon-containing layer whose thickness is, for example, within a range from less than a single atomic layer to several atomic layers is formed on the substrate 10 (that is, on a base film on the surface of the substrate 10).

<Source Gas Exhaust Step: S7052>

After the silicon-containing layer is formed on the surface of the substrate 10 by supplying the $Si_2Cl_6$ gas serving as the source gas into the reaction tube 110 through the nozzle 120 for a predetermined time, a supply of the $Si_2Cl_6$ gas is stopped. In the source gas exhaust step S7052, the inner atmosphere of the reaction tube 110 is vacuum-exhausted by the vacuum pump (not shown) to remove a residual gas in the reaction tube 110 such as the $Si_2Cl_6$ gas which did not react or which contributed to the formation of the silicon-containing layer out of the reaction tube 110.

In the source gas exhaust step S7052, the $N_2$ gas serving as the carrier gas is continuously supplied into the reaction tube 110 through the nozzle 120. The $N_2$ gas serves as a purge gas, which improves the efficiency of removing the residual gas in the reaction tube 110 such as the $Si_2Cl_6$ gas which did not react or which contributed to the formation of the silicon-containing layer out of the reaction tube 110.

<Reactive Gas Supply Step: S7053>

After the residual gas in the reaction tube 110 is removed out of the reaction tube 110, while the boat 300 is being rotated by driving the rotational driving motor 430, $O_2$ gas serving as the reactive gas is supplied into the reaction tube 110 through the nozzle 120, and a part of the $O_2$ gas which did not contribute to the reaction on the surface of the substrate 10 is exhausted through the exhaust pipe 130. Thereby, the $O_2$ gas is supplied to the substrate 10. Specifically, a flow rate of the $O_2$ gas may be set within a range from 0.2 slm to 10 slm, and more preferably, within a range from 1 slm to 5 slm.

When supplying the $O_2$ gas, a supply of the $N_2$ gas is stopped in order to prevent the $N_2$ gas from being supplied into the reaction tube 110 together with the $O_2$ gas. That is, the $O_2$ gas is supplied into the reaction tube 110 without being diluted with the $N_2$ gas. As a result, it is possible to improve a film-forming rate of the $SiO_2$ film. In the reactive gas supply step S7053, the temperature of the heater 101 is set to substantially the same temperature as that of the source gas supply step S7051.

In the reactive gas supply step S7053, similar to the source gas supply step S7051, by elevating and lowering the boat 300 at a predetermined time interval by operating the boat vertical driver 420 provided with the linear actuator to drive the shaft 421 in the vertical direction based on the process recipe read in the step S701, the relative position (height position) of the surface of the substrate 10 accommodated in the boat 300 with respect to the hole 121 of the nozzle 120 and the partition plate 203 of the partition plate support 200 can be switched between the plurality of positions (for example, the position shown in FIG. 3B and the position shown in FIG. 3C).

In the reactive gas supply step S7053, the $O_2$ gas is supplied into the reaction tube 110 without any other gas being supplied into the reaction tube 110 together with the $O_2$ gas. A substitution reaction occurs between the $O_2$ gas and at least a portion of the silicon-containing layer formed on the substrate 10 in the source gas ($Si_2Cl_6$ gas) supply step S7051. During the substitution reaction, silicon (Si) contained in the silicon-containing layer and oxygen (O) contained in the $O_2$ gas are bonded together. As a result, an $SiO_2$ layer containing silicon and oxygen is formed on the substrate 10.

<Reactive Gas Exhaust Step: S7054>

After the $SiO_2$ layer is formed, a supply of the $O_2$ gas into the reaction tube 110 through the nozzle 120 is stopped. Then, a residual gas in the reaction tube 110 such as the $O_2$ gas which did not react or which contributed to the formation of the $SiO_2$ layer and reaction by-products are removed out of the reaction tube 110 in the same manners as in the source gas exhaust step S7052.

<Performing a Predetermined Number of Times>

By performing a cycle in which the step S7051 through the step S7055 described above are sequentially performed in this order one or more times (that is, a predetermined number of times (n times)), the $SiO_2$ film of a predetermined thickness (for example, 0.1 nm to 2 nm) is formed on the substrate 10. It is preferable that the cycle described above is repeatedly performed a plurality of times, for example, preferably about 10 times to 80 times, and more preferably about 10 times to 15 times.

As described above, the source gas supply step S7051 and the reactive gas supply step S7053 are repeatedly performed while the relative position of the surface of the substrate 10 with respect to the hole 121 and the partition plate 203 is being switched between the plurality of positions (for example, the position shown in FIG. 3B and the position shown in FIG. 3C) by elevating and lowering the boat 300 at the predetermined time interval by operating the boat vertical driver 420 provided with the linear actuator to drive the shaft 421 in the vertical direction based on the process recipe read in the step S701. As a result, it is possible to form the film with a uniform thickness distribution on the surface of the substrate 10.

In addition, while the present embodiment is described by way of an example in which the boat 300 accommodating the substrates 10 is rotated by the rotational driving motor 430 in the source gas supply step S7051 and the reactive gas supply step S7053, the boat 300 may be continuously rotated by the rotational driving motor 430 during the source gas exhaust step S7052 and the reactive gas exhaust step S7054.

<After-Purge Step (Purge And Returning to Atmospheric Pressure Step): S706>

After repeatedly performing the step S7051 through the step S7055 of the step S705 the predetermined number of times, the $N_2$ gas is supplied into the reaction tube 110 through the nozzle 120, and is exhausted through the exhaust pipe 130. The $N_2$ gas serves as the purge gas, and the inner atmosphere of the reaction tube 110 is purged with the $N_2$ gas serving as the inert gas. Thereby, the residual gas in the reaction tube 110 or the reaction by-products remaining in the reaction tube 110 are removed out of the reaction tube 110. Then, the $N_2$ gas is filled in the reaction tube 110 until the inner pressure of the reaction tube 110 reaches an atmospheric pressure.

<Substrate Unloading Step: S707>

Thereafter, the vertical driving motor 410 is driven to rotate the ball screw 411 in an opposite direction such that the partition plate support 200 and the boat 300 are lowered from the reaction tube 110. As a result, the boat 300 accommodating the substrate 10 on which the film of a predetermined thickness is formed on the surface thereof is transferred (unloaded) to the storage chamber 500.

The substrate 10 with the film formed on the surface thereof is transferred (discharged) out of the boat 300 through the substrate loading/unloading port 310 so as to be taken out of the storage chamber 500. Thereby, the processing of the substrate 10 is completed.

While the present embodiment is described by way of an example in which the $SiO_2$ film is formed on the substrate 10, the present embodiment is not limited thereto. For example, instead of the $SiO_2$ film, the present embodiment may also be applied when a silicon nitride film ($Si_3N_4$ film) or a titanium nitride film (TiN film) is formed. In addition, the present embodiment may also be applied to form another film other than the films described above. For example, the present embodiment may also be applied to form a film containing an element such as tungsten (W), tantalum (Ta), ruthenium (Ru), molybdenum (Mo), zirconium (Zr), hafnium (Hf), aluminum (Al), silicon (Si), germanium (Ge) and gallium (Ga), a film containing an element of the same family as the elements described above, a compound film of one or more elements described above and nitrogen (that is, a nitride film) or a compound film of one or more elements described above and oxygen (that is, an oxide film). Further, when forming the films described above, a halogen-containing gas or a gas containing at least one of a halogen element, an amino group, a cyclopentane group, oxygen (O), carbon (C) or an alkyl group may be used.

According to the present embodiment, in accordance with a surface area of the substrate 10 or a type of the film to be formed, it is possible to form the film while changing the positional relationship between the substrate 10 and the hole 121 of the nozzle 120 through which a film-forming gas (that is, the source gas and the reactive gas) is supplied based on pre-set conditions. As a result, it is possible to improve a uniformity of the thickness distribution of the film formed on the surface of the substrate 10 accommodated in the boat 300.

While the technique of the present disclosure is described by way of an example in which the film-forming process is performed, the technique of the present disclosure is not limited thereto. For example, the technique of the present disclosure may also be applied when the etching process is performed.

When the technique of the present disclosure is applied to the etching process, by supplying an etching gas in the state in which the distance between the substrate 10 and the partition plate 203 above the substrate 10 (that is, the upper partition plate 2032) is narrowed as shown in FIG. 3B by operating the boat vertical driver 420 provided with the linear actuator to drive the shaft 421 in the vertical direction, it is possible to perform an "E process" of a DED (Deposition-Etch-Deposition) process. In the present specification, the term "DED process" refers to a process of repeatedly performing the film-forming process ("Deposition") and the etching process ("Etch") to form a predetermined film. The "E process" described above refers to the etching process.

Further, by widening the distance between the substrate 10 and the partition plate 203 above the substrate 10 (that is, the upper partition plate 2032) as shown in FIG. 3C while supplying the etching gas, it is possible to adjust a uniformity of etching on the surface of the substrate 10.

According to the technique of the present disclosure, a parameters for adjusting the distance between the substrate 10 and the partition plate 203 above the substrate 10 (that is, the upper partition plate 2032) may include the thickness distribution of the film, a temperature, a flow rate of the gas, a pressure, a time, a type of the gas, the surface area of the substrate 10. When information about the thickness distribution of the film is used as the parameter, a film thickness measuring apparatus is provided in the substrate processing apparatus 100, and the distance between the substrate 10 and the partition plate 203 above the substrate 10 (that is, the upper partition plate 2032) may be changed based on the result of measuring the thickness of the film.

Further, a decomposition amount of the gas may be detected by a sensor (not shown), and the distance between the substrate 10 and the partition plate 203 above the substrate 10 (that is, the upper partition plate 2032) may be changed based on data on the decomposition amount.

Second Embodiment

Figure 9:
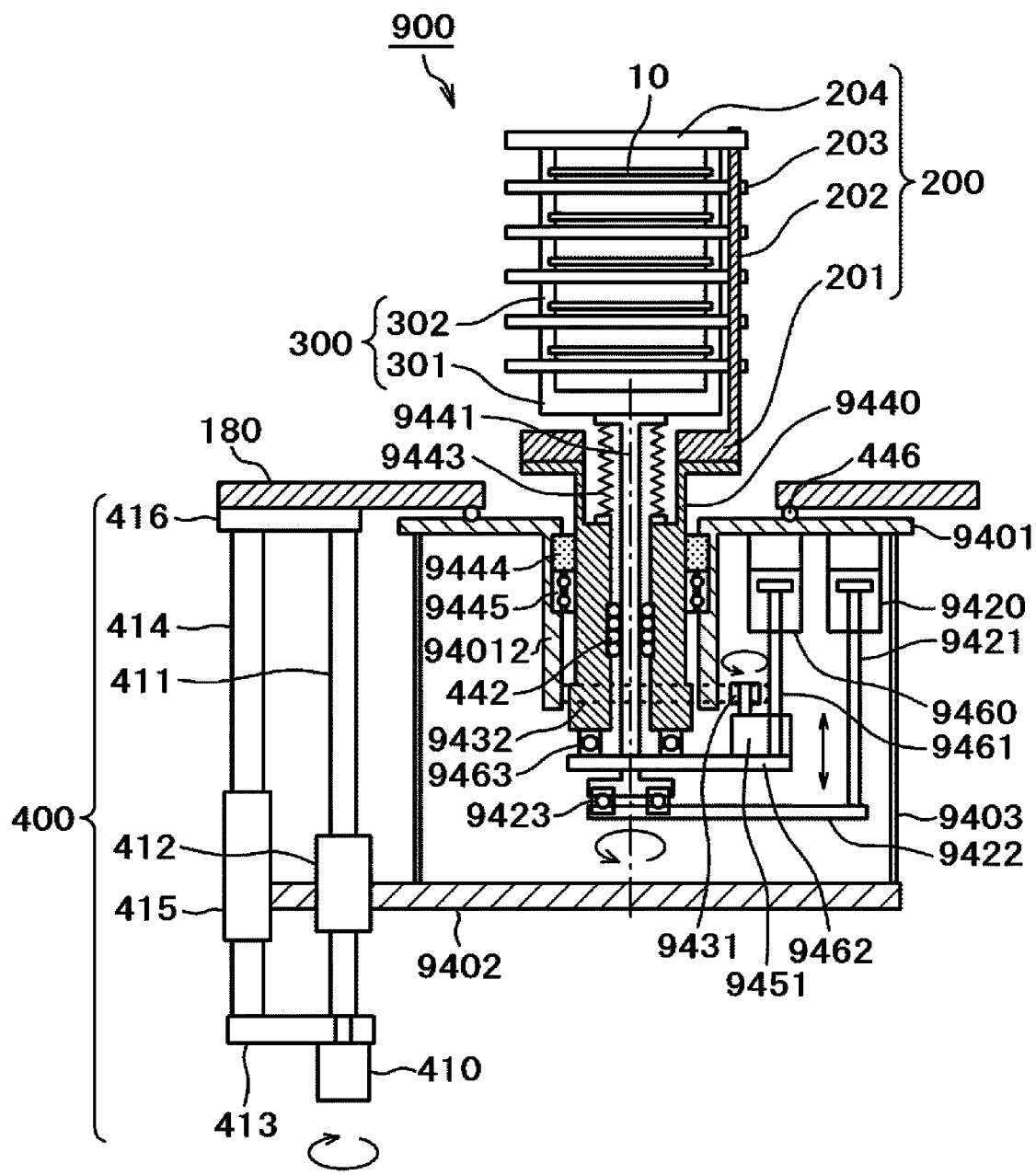
FIG. 9 is a cross-sectional view schematically illustrating a configuration of a substrate processing apparatus according to a second embodiment of the present disclosure.

FIG. 9 schematically illustrates a configuration of a substrate processing apparatus 900 according to a second embodiment of the present disclosure. The same components as those of the first embodiment will be denoted by like reference numerals, and detailed descriptions thereof will be omitted. Further, in the configuration of the substrate processing apparatus 900 according to the second embodiment, components such as the heater 101, the reaction tube 110, the gas supply nozzle 120, the manifold 111, the exhaust pipe 130 and the controller 260 described in the first embodiment are similarly provided. Since the components described above are substantially the same as those in the first embodiment, the components described above are omitted in FIG. 9.

According to the present embodiment, similar to the first embodiment, the partition plate support 200 and the substrate support (boat) 300 are driven by the vertical driver 400 in the vertical direction between the reaction tube 110 and the storage chamber 500, a support 9440 is rotationally driven by a rotational driving motor 9451 in the rotational direction around the center of the substrate 10 supported by the substrate support (boat) 300, a support structure 9441 fixed to the boat 300 is driven relatively in the vertical direction with respect to the support 9440 fixed to the partition plate support 200 by driving a plate 9422 in the vertical direction by a boat vertical driver 9420 provided with the linear actuator via a shaft 9421.

The configuration of the substrate processing apparatus 900 according to the present embodiment is different from the configuration of the substrate processing apparatus 100 described in the first embodiment in that a structure capable of independently adjusting the heights of the partition plate support 200 and the substrate support (boat) 300 is provided. The structure is capable of independently adjusting the heights of the partition plate support 200 and the substrate support (boat) 300 in a state where the partition plate support 200 and the substrate support (boat) 300 are elevated by the vertical driver 400 and a base flange 9401 is pressed against the chamber 180 via the O-ring 446.

That is, as shown in FIG. 9, the substrate processing apparatus 900 according to the present embodiment include a boat vertical driver 9460 provided with a second linear actuator capable of independently elevating and lowering the partition plate support 200 with respect to the substrate support (boat) 300. By the boat vertical driver 9460 provided with the second linear actuator, a plate 9462 is driven in the vertical direction via a shaft 9461 so as to elevate or lower the partition plate support 200 in the vertical direction independently of the substrate support (boat) 300.

The plate 9462 is connected to the support 9440 supporting the base 201 of the partition plate support 200 by the base 201 via a rotary seal structure 9423.

The boat vertical driver 9420 provided with the linear actuator and the boat vertical driver 9460 provided with the second linear actuator are fixed to the base flange 9401 serving as a lid supported by a side plate 9403 at a base plate 9402.

The rotational driving motor 9451 is attached to the plate 9462 driven in the vertical direction by the boat vertical driver 9460 provided with the second linear actuator.

The rotational driving motor 9451 is configured to drive a rotation transmission belt 9432 engaging with a tooth portion 9431 attached to a front end (tip) of the rotational driving motor 9451, and to rotationally drive the support 9440 engaging with the rotation transmission belt 9432. The support 9440 is configured to support the partition plate support 200 by the base 201, and to be driven by the rotational driving motor 9451 via the rotation transmission belt 9432 to rotate the partition plate support 200 and the boat 300.

According to the configuration of the substrate processing apparatus 900 according to the present embodiment, it is possible to independently adjust the height position of the substrate 10 accommodated in the boat 300 and the height position of the partition plate 203 fixed to the partition plate support 200 with respect to the hole 121 provided at the nozzle 120 shown in FIGS. 1 and 2.

Thereby, according to the present embodiment, in accordance with the surface area of the substrate 10 or the type of the film to be formed, it is possible to form the film while independently adjusting the height position of the substrate 10 accommodated in the boat 300 and the height position of the partition plate 203 fixed to the partition plate support 200 with respect to the hole 121 provided at the nozzle 120. As a result, it is possible to improve the uniformity of the thickness distribution of the film formed on the surface of the substrate 10 accommodated in the boat 300.

Third Embodiment

Figure 10:
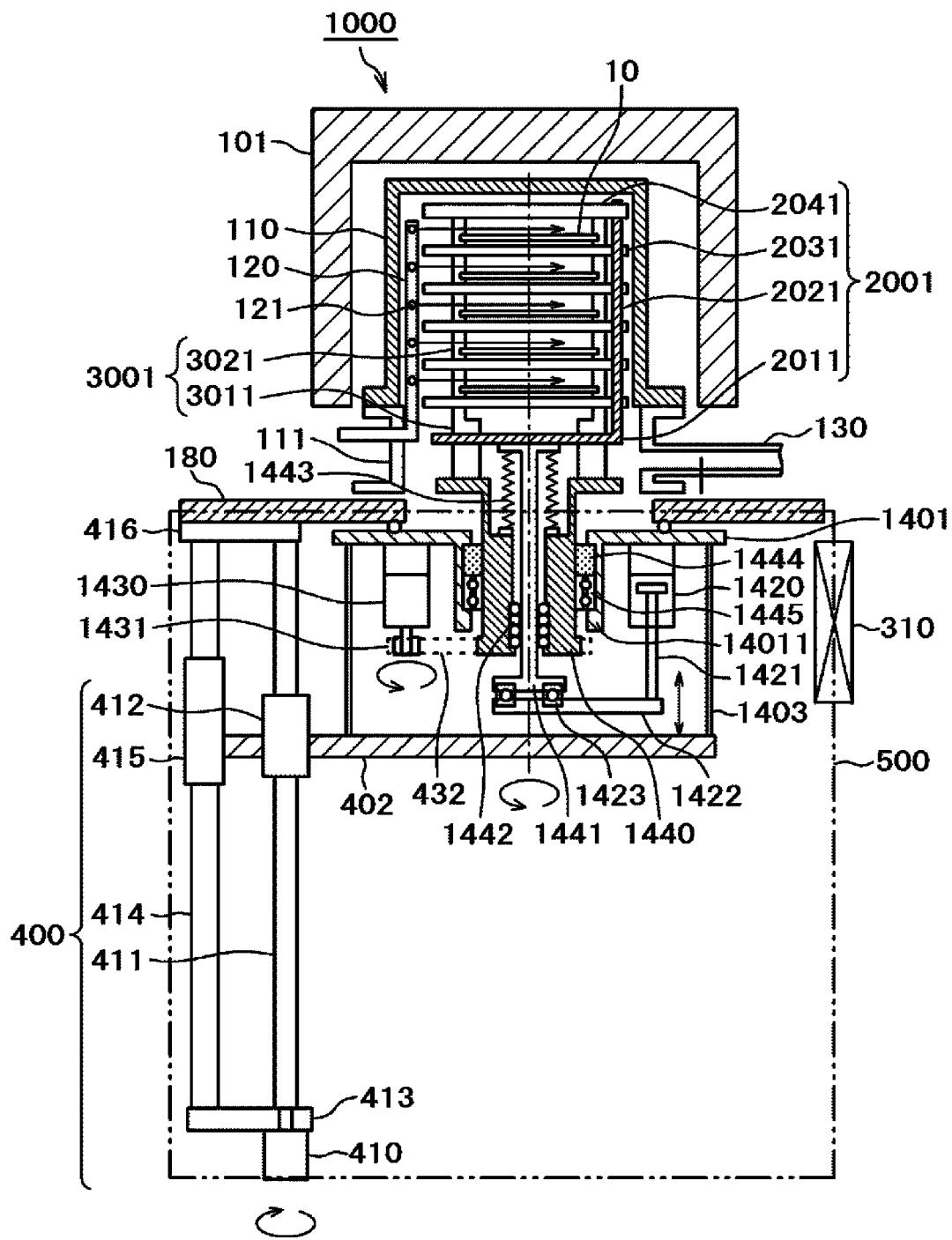
FIG. 10 is a cross-sectional view schematically illustrating a configuration of a substrate processing apparatus according to a third embodiment of the present disclosure.

FIG. 10 schematically illustrates a configuration of a substrate processing apparatus 1000 according to a third embodiment of the present disclosure. The same components as those of the first embodiment will be denoted by like reference numerals, and detailed descriptions thereof will be omitted.

The configuration of the substrate processing apparatus 1000 according to the present embodiment is different from the configuration of the substrate processing apparatus 100 described in the first embodiment in that, contrary to the description in the first embodiment, a structure capable of independently elevating and lowering a substrate support (boat) 3001 with respect to a partition plate support 2001 is provided.

According to the present embodiment, similar to the first embodiment, the partition plate support 2001 and the substrate support (boat) 3001 are driven by the vertical driver 400 in the vertical direction between the reaction tube 110 and the storage chamber 500 and in the rotational direction around the center of the substrate 10 supported by the substrate support (boat) 3001, and a support structure 1441 fixed to the boat 3001 is driven relatively in the vertical direction with respect to the support 1440 fixed to the partition plate support 2001 by driving a plate 1422 in the vertical direction by a boat vertical driver 1420 provided with the linear actuator via a shaft 1421.

That is, according to the present embodiment, the boat vertical driver 1420 provided with the linear actuator is configured to independently elevate or lower the substrate support (boat) 3001 with respect to the partition plate support 2001.

The boat vertical driver 1420 provided with the linear actuator is configured to drive the shaft 1421 in the vertical direction. The plate 1422 is attached to a front end (tip) of the shaft 1421. The plate 1422 is connected to the support structure 1441 fixed to a base 3011 of the boat 3001 via a bearing 1423.

On the other hand, the support structure 1441 is supported by the support 1440 via a linear guide bearing 1442. An upper surface of the support 1440 is connected to the base 3011 of the substrate support (boat) 3001. The support 1440 is separated from an inner cylinder portion 14011 of a base flange 1401 by a vacuum seal 1444, and a lower portion thereof is rotatably guided with respect to the inner cylinder portion 14011 of the base flange 1401 by a bearing 1445.

With such a configuration, when the shaft 1421 is driven in the vertical direction by the boat vertical driver 1420 provided with the linear actuator, it is possible to drive a partition plate 2031 fixed to the partition plate support 2001 relatively in the vertical direction with respect to the support structure 1441 fixed to the boat 3001.

In addition, by connecting the support structure 1441 to the plate 1422 via the bearing 1423, it is possible to rotate the boat 3001 together with the partition plate support 2001 when the boat 3001 is rotationally driven by a rotational driving motor 1430.

The support 1440 fixed to the partition plate support 2001 and the support structure 1441 fixed to the boat 3001 are connected by a vacuum bellows 1443.

According to the configuration of the substrate processing apparatus 1000 according to the present embodiment, with the height of the substrate 10 accommodated in the boat 3001 constant (fixed) with respect to the hole 121 provided at the nozzle 120, it is possible to adjust the height position of the partition plate 2031 fixed to the partition plate support 2001.

Thereby, according to the present embodiment, in accordance with the surface area of the substrate 10 or the type of the film to be formed, it is possible to form the film while changing the positional relationship between the partition plate 2031 capable of covering an upper surface or a lower surface of the substrate 10 and the hole 121 of the nozzle 120 through which the film-forming gas is supplied based on the pre-set conditions. As a result, it is possible to improve the uniformity of the thickness distribution of the film formed on the surface of the substrate 10 accommodated in the boat 3001.

Fourth Embodiment

Figure 11:
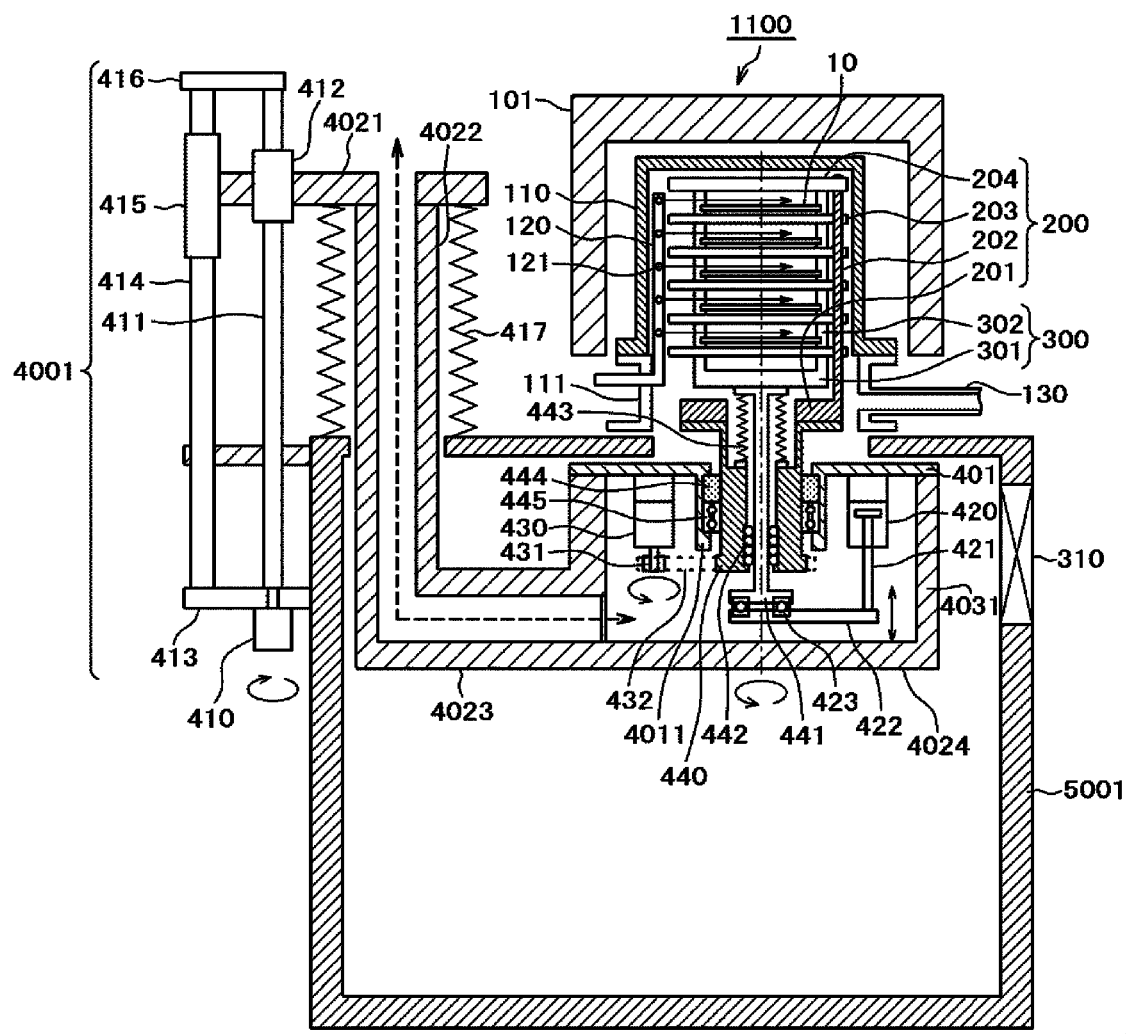
FIG. 11 is a cross-sectional view schematically illustrating a configuration of a substrate processing apparatus according to a fourth embodiment of the present disclosure.

FIG. 11 schematically illustrates a configuration of a substrate processing apparatus 1100 according to a fourth embodiment of the present disclosure. The same components as those of the first embodiment will be denoted by like reference numerals, and detailed descriptions thereof will be omitted.

The substrate processing apparatus 1100 according to the present embodiment is provided with a structure capable of vacuum-exhausting an inner atmosphere of a storage chamber 5001 by using a vacuum exhaust structure (not shown) with respect to the configuration of the substrate processing apparatus 100 described in the first embodiment. Thereby, it is possible to eliminate the vacuum sealing between the reaction tube 110 and the storage chamber 500 using the O-ring 446 as described with reference to FIG. 2 in the first embodiment, and it is also possible to change a height of the base flange 401 during the substrate processing.

As a result, according to the present embodiment, in addition to being capable of changing the height of the substrate support (boat) 300 with respect to the partition plate support 200 during the processing of the substrate 10 as described in the first embodiment, it is possible to change the height positions of the substrate support (boat) 300 and the partition plate support 200 together with respect to the hole 121 provided at the gas supply nozzle 120.

The same components as those of the first embodiment described with reference to FIGS. 1 and 2 will be denoted by like reference numerals, and detailed descriptions thereof will be omitted.

According to the present embodiment, as shown in FIG. 11, a vertical driver 4001 is arranged outside the storage chamber 5001, and a plate 4021 fixed to the vertical driver 4001 and displaced in the vertical direction by the vertical driver 4001 is connected to the storage chamber 5001 via a vacuum bellows 417 such that an inside of the storage chamber 5001 can be hermetically closed and vacuum-sealed.

That is, a structure capable of securing an airtightness of the inside of the storage chamber 5001 is provided by covering a space between the base flange 401 and the plate 422 with a side wall 4031, and a vacuum state inside of the storage chamber 5001 can be maintained while a space surrounded by the base flange 401, the plate 422 and the side wall 4031 is set to an atmospheric pressure through pipes 4023 and 4022 extending from the side wall 4031. A structure surrounded by the base flange 401, the plate 422 and the side wall 4031 may also be referred to as a "container".

Using the space provided by covering the space between the base flange 401 and the plate 422 with the side wall 4031, for example, it is possible to provide a configuration (not shown) of connecting electrical wirings of the elevators or the rotator described above or a configuration (not shown) of providing (connecting) cooling water for protecting the vacuum sealing (not shown).

According to the present embodiment, in addition to being capable of changing the height of the substrate support (boat) 300 with respect to the partition plate support 200 during the processing of the substrate 10, it is possible to change the height positions of the substrate support (boat) 300 and the partition plate support 200 together with respect to the hole 121 provided at the gas supply nozzle 120. As a result, during the processing of the substrate 10, it is possible to individually control the height of the partition plate 203 fixed to the partition plate support 200 and the height of the substrate 10 accommodated in the substrate support (boat) 300 with respect to the hole 121 provided at the gas supply nozzle 120.

Thereby, according to the present embodiment, it is possible to improve the uniformity of the thickness distribution of the film formed on the surface of the substrate 10 accommodated in the boat 300.

As described above, according to the technique of the present disclosure, it is possible to uniformly form the film while changing the positional relationship between the substrate 10 and the hole 121 of the nozzle 120 through which the film-forming gas is supplied in accordance with the surface area of the substrate 10 or the type of the film to be formed.

In addition, according to the technique of the present disclosure, the nozzle through which the film-forming gas is supplied is fixed with respect to a reaction chamber (that is, the reaction tube), and the substrate support (boat) in which the substrates are provided in a multistage manner is configured to be elevated or lowered by the vertical driver. When it is preferable to partition the reaction chamber in which the film-forming process is performed and the storage chamber located below the reaction chamber so as to shut off the gas or to shut off the pressure, the reaction chamber and the storage chamber are separated using a sealing by the O-ring, and are sealed with a elastic seal structure (bellows) corresponding to a stroke of a vertical movement of the substrate support (that is, a change in a relative position of the nozzle). On the other hand, when a pressure of a loading region (inside the storage chamber 500) is substantially the same as a pressure of the reaction chamber (inside the reaction tube 110), the sealing by the O-ring is not performed, and the reaction chamber and the vacuum loading region (inside the storage chamber 500) are in communication with each other. In such a case, the inert gas is supplied through the vacuum loading region so as to form a pressure gradient. Thereby, it is possible to shut off the gas.

In addition, according to the technique of the present disclosure, by rotating the substrate during the film-forming process, it is possible to supply the film-forming gas ejected through the nozzle through which the film-forming gas is supplied while changing a flow velocity of the gas (film-forming gas) at a surface layer of the substrate by adjusting the distance between the nozzle and the surface of the substrate. It is also possible to adjust a decomposition state of the film-forming gas, which easily undergoes a gas phase reaction, until the film-forming gas reaches the surface layer of the substrate and contributes to the film-forming process.

As described above, according to the technique of the present disclosure, there is provided a method of manufacturing a semiconductor device of forming a film on a plurality of substrates by accommodating a substrate support into a reaction tube by driving the substrate support by a vertical driver in a state where a plurality of substrates are supported by the substrate support at intervals in a vertical direction; heating the plurality of substrates supported by the substrate support accommodated in the reaction tube by a heater provided around the reaction tube; and repeatedly performing (a) supplying a source gas to the plurality of substrates supported by the substrate support accommodated in the reaction tube through a plurality of holes provided at a gas supply nozzle and exhausting the supplied source gas from the reaction tube and (b) supplying the reactive gas to the plurality of substrates through the plurality of holes provided at a gas supply nozzle and exhausting the supplied reactive gas from the reaction tube, wherein (a) and (b) are performed in a state where a height of each of the plurality of partition plates accommodated in the reaction tube is adjusted by the vertical driver and a distance (height) between each of the plurality of substrates accommodated in the substrate support and each of the plurality of holes of the gas supply nozzle is adjusted in accordance with pre-set conditions.

In addition, according to the technique of the present disclosure, the source gas and the reactive gas are supplied through the holes of the nozzle through which the gas is supplied, wherein the holes are arranged at the nozzle in the vertical direction at the same interval as that of the substrates accommodated in the substrate support.

In addition, according to the technique of the present disclosure, the supply of the source gas and the supply of the reactive gas through the holes of the nozzle through which the gas is supplied are repeatedly performed while controlling the height of the substrate support accommodated in the reaction tube by the vertical driver and changing the distance (height) between each of the plurality of substrates accommodated in the substrate support and each of the holes of the nozzle through which the gas is supplied.

PREFERABLE EXAMPLES OF PRESENT DISCLOSURE

Hereinafter, preferable examples of the technique of the present disclosure are described.
<Supplementary Note 1>
Provided is a substrate processing apparatus including:
a substrate support in which a plurality of substrates are accommodated;
a plurality of partition plates configured separately from the substrate support and provided above the plurality of substrates accommodated in the substrate support, respectively;
a partition plate support including a support configured to support the plurality of partition plates;
a substrate support elevator configured to elevate and lower the substrate support; and
a controller configured to be capable of controlling the substrate support elevator so as to change a positional relationship between each of the plurality of substrates and each of the plurality of partition plates in a vertical direction.
<Supplementary Note 2>
In the apparatus of Supplementary Note 1, further comprises
a partition plate support elevator configured to elevate and lower the partition plate support.

<Supplementary Note 3>
In the apparatus of Supplementary Note 2, the controller is further configured to be capable of changing the positional relationship between each of the plurality of substrates and each of the plurality of partition plates in the vertical direction by elevating or lowering either the substrate support elevator or the partition plate support elevator.
<Supplementary Note 4>
In the apparatus of Supplementary Note 2, an elevating shaft of the substrate support elevator and an elevating shaft of the partition plate support elevator are configured to be concentric with each other. By configuring each elevating shaft to be concentric with each other as above, it is possible to simplify a structure of a rotator. Further, it is possible to easily control a synchronization of a rotation between the substrate support and the partition plate support. Further, the elevating shaft of the substrate support elevator may refer to the support structure 9441 described above. Further, the elevating shaft of the partition plate support elevator may refer to the support 9440 described above.
<Supplementary Note 5>
In the apparatus of Supplementary Note 2, an elevating shaft of the substrate support elevator is disposed in an elevating shaft of the partition plate support elevator.
<Supplementary Note 6>
In the apparatus of Supplementary Note 2, an elevating shaft of the partition plate support elevator is disposed in an elevating shaft of the substrate support elevator.
<Supplementary Note 7>
In the apparatus of Supplementary Note 2, a driver of the substrate support elevator is also configured to elevate or lower a driver of the partition plate support elevator.
<Supplementary Note 8>
In the apparatus of Supplementary Note 2, a transfer chamber is provided below a process chamber, and a lower end portion of the transfer chamber is hermetically sealed by the substrate support elevator and the partition plate support elevator.
<Supplementary Note 9>
In the apparatus of Supplementary Note 2, the apparatus further comprises a lid configured to support the partition plate support, and a lower end of a process chamber in which the substrate is processed is closed by the lid.
<Supplementary Note 10>
In the apparatus of Supplementary Note 2, the apparatus further comprises a lid configured to support the substrate support, and a lower end of a process chamber in which the substrate is processed is closed by the lid.
<Supplementary Note 11>
In the apparatus of Supplementary Note 1, a diameter of the partition plate is set to be greater than a diameter of the substrate.
<Supplementary Note 12>
In the apparatus of Supplementary Note 1, an area of the partition plate is set to be greater than an area of the substrate.
<Supplementary Note 13>
In the apparatus of Supplementary Note 1, the controller is further configured to be capable of controlling one or both of the substrate support elevator and a partition plate support elevator based on distance data between the substrate and the partition plate. In the Supplementary Note 13, the distance data refers to, for example, an actual distance or n times of a predetermined distance. In the Supplementary Note 13, the distance data may be recorded in the RAM 260b, the memory 260c described above, or the like.

<Supplementary Note 14>

In the apparatus of Supplementary Note 1, the controller is further configured to be capable of changing a distance between an upper surface of the substrate and the partition plate by driving one or both of the substrate support elevator and a partition plate support elevator based on pre-set film thickness data. In the Supplementary Note 14, the pre-set film thickness data may include at least one of film thickness information, a thickness distribution of a film, a thickness uniformity of the film, a thickness difference of the film (±X %) between a center and an outer periphery of the film, actual thickness data of the film, or the like, and is different from recipe data. The data described above may be obtained via a network. In addition, a relationship between the pre-set film thickness data and the distance may be determined by referring to a data table indicating at least a relationship between the thickness of the film (data such as a temperature, a flow rate of a gas, a pressure, a supply time, a type of the gas, a surface area of the substrate and the like) and a pitch. Alternatively, it may be calculated using a predetermined function. In such a case, the pitch (position of a first elevator) is calculated based on the pre-set film thickness data and the related data. Data such as the pre-set film thickness data and the data table shown in the Supplementary Note 14 may be recorded in the RAM 260b, the memory 260c described above, or the like.

<Supplementary Note 15>

In the apparatus of Supplementary Note 1, the controller is further configured to be capable of controlling one or both of the substrate support elevator and a partition plate support elevator such that a distance between an upper surface of the substrate and the partition plate is smaller than a distance between a transfer position (home position) and the partition plate.

<Supplementary Note 16>

In the apparatus of Supplementary Note 1, the controller is further configured to be capable of controlling one or both of the substrate support elevator and a partition plate support elevator such that a distance between an upper surface of the substrate and the partition plate is greater than a distance between a transfer position (home position) and the partition plate.

<Supplementary Note 17>

In the apparatus of Supplementary Note 1, a pitch is changed when a temperature of the substrate is elevated. In such a case, when the temperature of the substrate is elevated by being heated by the heater 101, the pitch (that is, a distance between the back surface of the substrate 10 and the partition plate 203 below the substrate 10) is narrowed (the state shown in FIG. 3C). Narrowing the pitch is performed at least before the supply of the source gas. In addition, the pitch during the supply of the source gas may be set to be different from the pitch during the supply of the reactive gas. Further, the pitch may be changed during the supply of the source gas (or the reactive gas). In addition, the operation timing of the substrate support and the partition plate support can be set appropriately.

<Supplementary Note 18>

In the apparatus of Supplementary Note 17, the distance between the back surface of the substrate and the partition plate below the substrate is shorter while the temperature of the substrate is being elevated than while the substrate is being processed.

<Supplementary Note 19>

In the apparatus of Supplementary Note 17, the partition plate is provided with a notch of the substrate support, and the partition plate may support the substrate.

According to some embodiments of the present disclosure, it is possible to control the distribution of the concentration of the gas on the surface of each of the plurality of substrates, and also possible to improve the thickness uniformity of the film formed on each of the plurality of substrates when the plurality of substrates are processed simultaneously.

Further, according to some embodiments of the present disclosure, by processing the plurality of substrates by controlling the distribution of the concentration of the gas on the surface of each of the plurality of substrates when the plurality of substrates are processed simultaneously, it is possible to improve the efficiency of the material gas to be supplied, and also possible to reduce the cost by reducing a waste of the material gas.

What is claimed is:

1. A substrate processing apparatus comprising:
   a substrate retainer comprising:
      a substrate support configured to support a plurality of substrates at intervals in a vertical direction; and
      a partition plate support configured to support a plurality of partition plates arranged between the plurality of substrates supported by the substrate support;
   a reaction tube configured to accommodate the substrate retainer in which the plurality of substrates are supported by the substrate support;
   a first driver configured to move the substrate retainer in the vertical direction to transfer the substrate retainer into or out of the reaction tube;
   a second driver moved by the first driver in the vertical direction together with the substrate retainer, and configured to rotate the substrate retainer in a state where the substrate retainer is inserted in the reaction tube and to change a distance between each of the plurality of substrates supported by the substrate support and each of the plurality of partition plates supported by the partition plate support by moving at least one of the substrate support and the partition plate support in the vertical direction;
   a heater provided around the reaction tube and configured to heat the plurality of substrates;
   a gas supplier comprising a nozzle provided with a hole through which a gas is supplied to the plurality of substrates supported by the substrate support accommodated in the reaction tube;
   an exhauster through which the gas supplied through the gas supplier is exhausted out of the reaction tube; and
   a controller configured to be capable of controlling the first driver, the second driver and the gas supplier such that the gas is supplied to the plurality of substrates while changing at least one of a relative position of each of the plurality of substrates and a relative position of each of the plurality of partition plates with respect to the hole by driving the second driver in a state where the substrate retainer is inserted in the reaction tube by the first driver,
   wherein the second driver comprises:
      a rotational driver configured to rotate the substrate support and the partition plate support;
      a substrate support vertical driver configured to move the substrate support in the vertical direction with respect to the partition plate support; and
      a partition plate support vertical driver configured to move the partition plate support in the vertical direction with respect to the substrate support.

2. The substrate processing apparatus of claim 1, wherein a height of each of the plurality of substrates with respect to the hole is changed by the substrate support vertical driver.

3. The substrate processing apparatus of claim 1, wherein a height of the partition plate support with respect to the hole is changed by the partition plate support vertical driver.

4. The substrate processing apparatus of claim 1, wherein the substrate support and the partition plate support are connected by a vacuum bellows.

5. The substrate processing apparatus of claim 4, wherein the second driver is disposed under an atmospheric pressure.

6. The substrate processing apparatus of claim 5, further comprising
a storage chamber configured to accommodate the second driver and the substrate retainer lowered by the first driver from the reaction tube.

7. The substrate processing apparatus of claim 6, wherein the storage chamber is further configured to accommodate the first driver.

8. The substrate processing apparatus of claim 6, wherein an inside of the storage chamber is hermetically sealed with respect to an outside of the storage chamber,
wherein the second driver is provided inside the storage chamber while accommodated in a container at the atmospheric pressure hermetically sealed with respect to the storage chamber, and
wherein the second driver is moved in the vertical direction by the first driver provided outside the storage chamber.

9. An elevator comprising:
a first driver configured to move a substrate retainer in a vertical direction to transfer the substrate retainer into or out of a reaction tube, wherein the substrate retainer comprises:
a substrate support configured to support a plurality of substrates at intervals in the vertical direction; and
a partition plate support configured to support a plurality of partition plates arranged between the plurality of substrates supported by the substrate support; and
a second driver moved by the first driver in the vertical direction together with the substrate retainer, and configured to rotate the substrate retainer in a state where the substrate retainer is inserted in the reaction tube and to change relative positions of the substrate retainer and the partition plate support in the vertical direction,
wherein the second driver comprises:
a rotational driver configured to rotate the substrate support and the partition plate support;
a substrate support vertical driver configured to move the substrate support in the vertical direction with respect to the partition plate support; and
a partition plate support vertical driver configured to move the partition plate support in the vertical direction with respect to the substrate support.

10. A method of manufacturing a semiconductor device, comprising:
(a) accommodating a substrate retainer into a reaction tube by moving the substrate retainer by a first driver, wherein the substrate retainer comprises:
a substrate support configured to support a plurality of substrates at intervals in a vertical direction; and
a partition plate support configured to support a plurality of partition plates arranged between the plurality of substrates supported by the substrate support;
(b) heating the plurality of substrates by a heater provided around the reaction tube;
(c) supplying a gas to the plurality of substrates through a plurality of gas supply holes provided at a gas supply nozzle; and
(d) exhausting the gas,
wherein the second driver comprises:
a rotational driver configured to rotate the substrate support and the partition plate support;
a substrate support vertical driver configured to move the substrate support in the vertical direction with respect to the partition plate support; and
a partition plate support vertical driver configured to move the partition plate support in the vertical direction with respect to the substrate support, and
wherein, in (c), at least one of a height of each of the plurality of substrates and a height of each of the plurality of partition plates with respect to each of the plurality of gas supply holes is adjusted by a second driver.

11. The method of claim 10, wherein
the height of each of the plurality of substrates with respect to each of the plurality of gas supply holes is changed by the substrate support vertical driver.

12. The method of claim 10, wherein
the height of each of the plurality of partition plates with respect to each of the plurality of gas supply holes is changed by the partition plate support vertical driver.

13. The method of claim 10, wherein
the height of each of the plurality of substrates with respect to each of the plurality of gas supply holes is changed by the substrate support vertical driver, and the height of each of the plurality of partition plates with respect to each of the plurality of gas supply holes is changed by the partition plate support vertical driver.

* * * * *